United States Patent [19]

Hsieh et al.

[11] Patent Number: 5,426,738
[45] Date of Patent: Jun. 20, 1995

[54] APPARATUS FOR FLEXIBLY ROUTING SIGNALS BETWEEN PINS OF ELECTRONIC DEVICES

[75] Inventors: Wen-Jai Hsieh, Vancouver, Wash.; Yih-Chyun Jenq, Lake Oswego, Oreg.; Chi-Song Horng, Palo Alto, Calif.

[73] Assignee: I-Cube, Inc., Santa Clara, Calif.

[21] Appl. No.: 171,752

[22] Filed: Dec. 21, 1993

Related U.S. Application Data

[63] Continuation of Ser. No. 785,082, Oct. 30, 1991, abandoned.

[51] Int. Cl.⁶ .................................................. G06F 3/00
[52] U.S. Cl. .................................... 395/275; 395/250; 364/DIG. 1; 364/239
[58] Field of Search ............ 395/275, 250, 239; 358/280, 275

[56] References Cited

U.S. PATENT DOCUMENTS

| | | | |
|---|---|---|---|
| 4,453,229 | 6/1984 | Schaire | 364/900 |
| 4,603,383 | 7/1986 | Tanaka et al. | 395/200 |
| 4,703,198 | 10/1987 | Porter et al. | 307/473 |
| 4,703,394 | 10/1987 | Petit et al. | 361/413 |
| 4,807,183 | 2/1989 | Kung et al. | 364/900 |
| 5,036,473 | 7/1991 | Butts et al. | 364/489 |
| 5,072,366 | 12/1991 | Simcoe | 395/200 |
| 5,079,693 | 1/1992 | Miller | 395/250 |
| 5,088,091 | 2/1992 | Schroeder et al. | 370/94.3 |
| 5,224,213 | 6/1993 | Dieffendrfer et al. | 395/250 |

*Primary Examiner*—Christopher B. Shin
*Attorney, Agent, or Firm*—Smith-Hill and Bedell

[57] ABSTRACT

A field programmable circuit board provides a set of sockets for receiving electronic components, a set of connector pins for providing external access to the board and an array of field programmable interconnect devices (FPIDs). The FPIDs are buffered, multiple port cross-point switches that may be programmed by a host computer to selectively connect terminals of the components mounted in the sockets to one another or to the external connector pins. Signal buffers within the FPID ports automatically sense direction of flow of bidirectional signals routed by the FPIDs and buffer the signals in the appropriate direction. Each FPID buffer also samples and stores data indicating states of the buffered signals over several system clock cycles for subsequent read out by the host computer.

5 Claims, 14 Drawing Sheets

APPARATUS FOR FLEXIBLY ROUTING SIGNALS BETWEEN PINS OF ELECTRONIC DEVICES

This is a continuation of application Ser. No. 07/785,082 filed Oct. 30, 1991 and now abandoned.

CROSS-REFERENCE TO RELATED APPLICATIONS

A field programmable interconnect device described herein is also described and claimed in co-pending patent application Ser. No. 07/912,975 entitled "Field Programmable Interconnect Device" filed concurrently, now patented herewith (U.S. Pat. No. 5,282,271). A bi-directional bus repeater as described herein is also described and claimed in co-pending patent application Ser. No. 07/785,299 entitled "Bi-directional Bus Repeater" filed concurrently herewith, now patented (U.S. Pat. No. 5,202,593).

BACKGROUND OF THE INVENTION

The present invention relates in general to electronic systems and in particular to a system for mounting and flexibly interfacing the various components of an electronic system.

Before fabricating a new integrated circuit to be included in an electronic system, circuit designers usually employ computer programs to simulate the integrated circuit. Computer simulations help designers to test the new circuits in order to ensure they will perform as expected. However, circuit designers rarely perform computer simulations of entire circuit boards to ensure that all components on a board will work together as expected. Modern circuit board systems typically contain several relatively large integrated circuits, each of which alone may be difficult to simulate, and simulating an entire circuit board is often prohibitively time-consuming.

Thus, circuit designers usually fabricate a prototype circuit board and then test the actual operation of the system with the components mounted on the prototype board. Designers find it necessary during the system test and development process to fabricate several successive versions of a circuit board since even small changes in any component can require a change to the board. Also prototype circuit boards themselves may have design or construction defects and may have to be redesigned or refabricated when errors are discovered during the testing process.

Design and fabrication of each successive version of a prototype circuit board are expensive and can take several weeks to complete. The need to fabricate prototype circuit boards therefore often adds much time and expense to the process of developing new electronic systems.

In the early phases of the process of designing a large logic circuit, engineers typically partition the circuit into several smaller blocks of logic. The individual logic blocks initially have well-defined interfaces with one another and well-defined performance specifications, but the detailed specification of logic block designs may be left to much later in the design process. By delaying the detailed design of the individual logic blocks, the designer can focus on "higher level" aspects early in the design process. Partitioning a circuit into separate blocks with well-defined interfaces also enables a designer to delegate the detailed design of the blocks to independent teams that need not spend much time coordinating their designs.

Logic blocks are often implemented by custom-designed integrated circuits, but for many years the use of end-user programmable logic devices has also been well-accepted in digital logic design practice. These devices can be programmed by externally generated programming signals to implement user-specified digital logic operations. Early embodiments of the concept include Programmable Array Logic devices (PALs) and Programmable Logic Devices (PLDs). PALs and PLDs serve as a convenient means for integrating a small number (typically 5 to 10) of small or medium scale integrated devices. In recent years a new architectural variation of such programmable logic devices, the Field Programmable Gate Array (FPGA) offering a much higher capacity (thousands of gates) and architectural flexibility, has gained wide popularity.

PALs, PLDs and FPGAs are often employed during the early design phase of an electronic system to implement a block of logic even when that block is ultimately to be implemented by a custom designed integrated circuit. The use of these programmable devices allows the designer to quickly test and evaluate alternative ways of implementing a circuit. Programmable logic devices may also be incorporated into a final circuit design to permit end-users to easily alter operation of the block of logic to fit their particular needs.

Programmable logic devices are most suitable when the block of logic they are to implement can fit within a single device. When a block of logic is too large, the designer can partition the block into smaller blocks, each of which may be implemented by a separate programmable logic device or other components. However, the problem of interconnecting separate programmable logic devices often proves very troublesome. Integrated circuit devices are typically interconnected by copper traces on a printed circuit board and such circuit boards are inflexible and are time-consuming to manufacture. When a designer implements a logic block using several programmable logic devices, the designer must create a circuit board to interconnect them. When the designer subsequently changes the block design, he may be forced to create a new circuit board. Thus the advantage of being able to quickly modify and test various designs of a logic block implemented by programmable logic devices may be lost when the designer is forced to fabricate new circuit boards to interconnect them.

One solution is to impose severe restrictions on the permissible partitions of the logic block so as not to disturb the interconnections between programmable logic devices implementing the block. However, this is undesirable because it places unnecessary limitations on the design.

U.S. Pat. No. 5,036,473 entitled "Method of Using Electronically Reconfigurable Logic Circuits", issued Jul. 30, 1991 to Butts et al, attempts to solve the problems of both implementing and interconnecting blocks of logic of a prototype circuit by providing a circuit board on which several programmable logic devices and programmable crossbar switches are permanently mounted. There are also sockets for mounting other circuit components such as custom integrated circuits that may be supplied by a user.

A crossbar switch has several I/O pins and can be programmed by an externally generated programming signal to route data signals arriving on any one I/O pin to any other I/O pin. In the Butts et al system, the I/O pins of the crossbar switches are connected to one another and to the I/O ports of the programmable logic devices and user device sockets in a distributed fashion. By properly programming the crossbar switches, an I/O port of any programmable logic device or user supplied device can be connected to an I/O port of any other programmable logic device or to any other I/O port of any user-supplied device mounted on the board. With this system, when change to a block of logic implemented by programmable logic devices requires changes in interconnections therebetween, the interconnection changes can be quickly and easily handled by reprogramming the crossbar switches. No alteration in circuit board hardware is required.

Crossbar switches of the prior art may be either active or passive. An "active" crossbar switch includes buffers that actively drive signals at its output I/O pins in response to signals at its input I/O pins. Active buffering ensures that the signals are not degraded as they pass through the crossbar switches between programmable logic devices. A "passive" crossbar switch simply passes signals between its I/O pins without buffering. Passive crossbar switches can accommodate either unidirectional or bidirectional signals, but since the signals must pass through unidirectional buffers, prior art active crossbar switches can only accommodate unidirectional signals.

Butts et al disclose active buffering to interconnect programmable logic devices and user-supplied components mounted on the board. A problem arises when the block of logic to be implemented includes bi-directional buses. Butts et al suggest either avoiding bi-directional buses by partitioning bi-directional buses into two unidirectional buses (FIGS. 13 and 14) or using logic or gating in the crossbar switch to enable buffers in the crossbar switch (FIGS. 15 and 16). In the former case, the devices being interconnected must have an input and an output terminal because the "bi-directional" bus actually comprises two unidirectional buses. In the latter case, the devices being interconnected by a true bi-directional bus must supply the crossbar switch with an enable signal input indicating direction of signal flow.

These methods solve the problem of actively buffering "bi-directional" signals passing between components only when the designer has control over the implementation of the devices being interconnected. The designer must ensure that such devices have only unidirectional inputs and outputs or that the devices supply an extra direction indicating enable signal with each bi-directional input/output signal. In cases where the logic is entirely implemented by programmable logic devices, the designer does have such control over device implementation. However, in many cases the user may wish to interconnect existing integrated circuits that have true bi-directional input/output buses but which do not provide output direction indicating enable signals. In such a situation, the Butts et al system is unable to provide actively buffered bi-directional interfaces between circuit components.

SUMMARY OF THE INVENTION

In accordance with one aspect of the present invention, a field programmable circuit board (FPCB) includes a set of socket holes for receiving pins of integrated circuits and other electronic components, a set of connectors for providing external access to the board and an array of field programmable interconnect devices (FPIDs). Each FPID is an integrated circuit chip including a multiple port, cross-point switch. The ports of the FPIDs are connected to one another and to the socket holes and external connector pins. A host computer accessing the FPCB through a serial bus can program the FPIDs to logically connect terminals of components mounted in the sockets to one another or to the external connector pins. When a user has placed components in the sockets and the host computer has programmed the FPIDs to make the necessary connections, the FPCB operates as a prototype circuit board, permitting the components to operate together as a unified electronic system.

In accordance with another aspect of the present invention, each FPID buffer port may be programmed to operate in various modes including unidirectional and bi-directional, with or without tristate control, and to operate at either TTL or CMOS input or output logic levels with adjustable pull-up currents. Each FPID buffer port may also be programmed to perform various operations on buffered signals including adjustably delaying the signal, inverting it or forcing it high or low.

In accordance with a further aspect of the present invention, each port of an FPID samples and stores data indicating states of the signal passing through it over the last several system clock cycles. The FPID can subsequently read out the stored data to a host computer, thereby enabling the host computer to show a user successive logic states of signals transmitted between components interconnected by the FPIDs. This data helps a user to understand the operation of the system under test and obviates the need for the user to probe the circuit with a logic analyzer.

It is accordingly an object of the present invention to provide an improved system for flexibly mounting and interconnecting components of an electronic system.

It is another object of the invention to provide an improved system for flexibly buffering signals transmitted between electronic devices.

It is a further object of the invention, to provide a "smart" buffer that samples, stores and reads out data indicating successive logic states of the signal that it buffers.

The concluding portion of this specification particularly points out and distinctly claims the subject matter of the present invention. However, those skilled in the art will best understand both the organization and method of operation of the invention, together with further advantages and objects thereof, by reading the following description in view of the accompanying drawings wherein like reference characters refer to like elements.

DESCRIPTION OF THE PREFERRED EMBODIMENT

The present invention relates to a field programmable circuit board, a device for flexibly mounting and interconnecting a set of electronic components such as integrated circuits and other devices to form a prototype electronic system.

Figure 1:
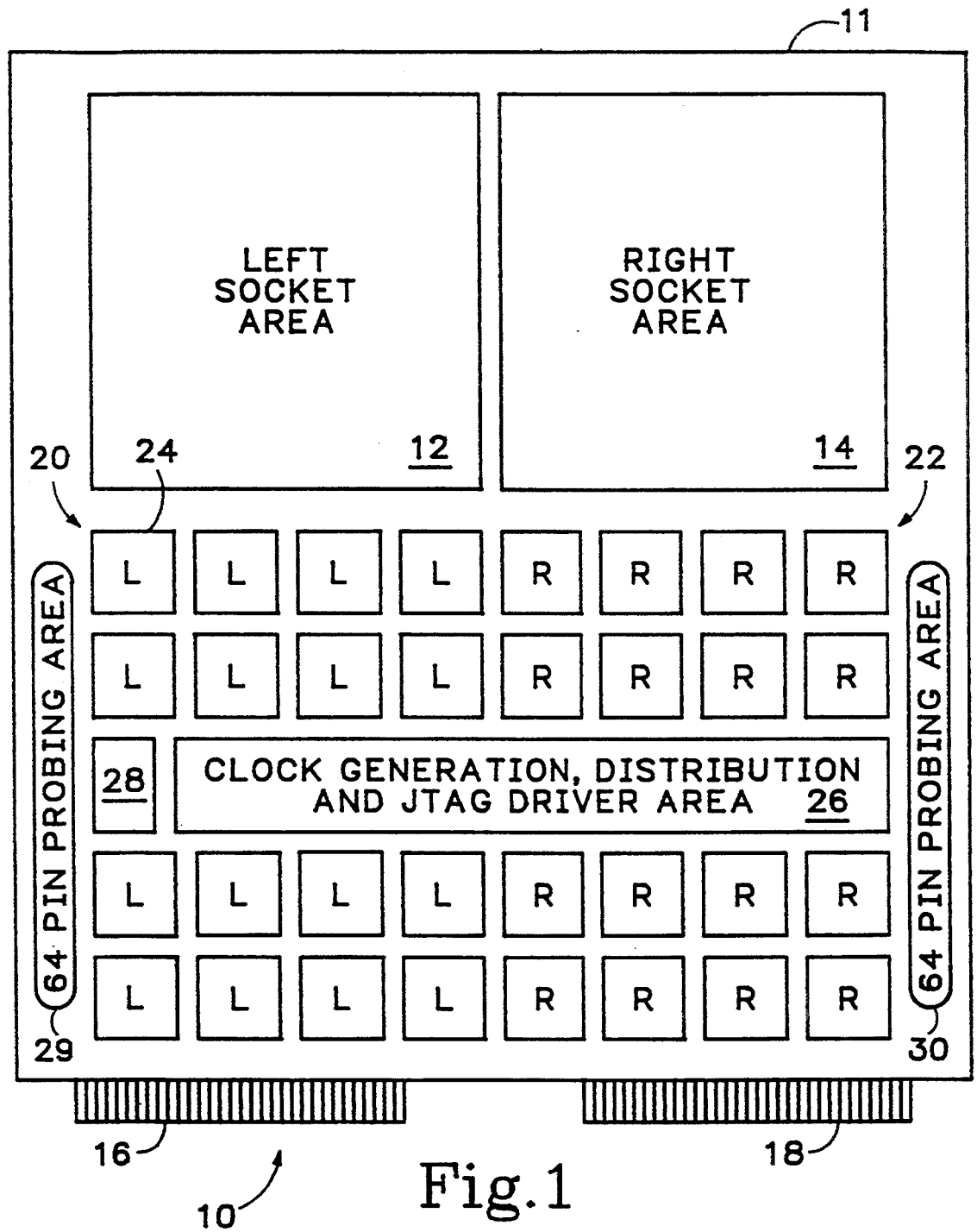
FIG. 1 illustrates a layout of a field programmable circuit board in accordance with the present invention.

FIG. 1 illustrates the layout of a field programmable circuit board (FPCB) 10 in accordance with the present invention. FPCB 10 includes a board 11 on which are mounted left and right user device socket areas 12 and 14 wherein areas 12 and 14 provide sockets for mounting the various electronic components of the prototype electronic system. FPCB 10 also includes left and right 224-pin male edge connectors 16 and 18 for connecting the FPCB to a mother board. A pair of 64-pin probing areas 29 and 30 are mounted at the right and left edges of the board 11 while left (L) and right (R) clusters 20 and 22 of field programmable interconnect devices (FPIDs) 24 are also mounted on board 11.

Each FPID 24 is an integrated circuit chip including a multiple port cross-point switch that can be programmed to logically connect any one port to any other port. The ports of the FPIDs 24 in left cluster 20 are externally connected through microstrip wiring on circuit board 11 to sockets in left socket area 12, to pins in probing area 29 and to pins of edge connector 16. Similarly, the ports of the FPIDs 24 in right cluster 22 are connected to sockets in right socket area 14, to pins in probing area 30 and to pins of edge connector 18. Various ports of FPIDs 24 in left cluster 20 are wired to ports of FPIDs 24 in right cluster 22.

However, The FPIDs can selectively interface terminals of the components mounted in the socket areas 12 and 14 with one another, with the external connector pins 16 and 18 or with pins of probing areas 29 and 30. The pins of the 64-pin probing areas 29 and 30 permit a user to connect external equipment that may be included in the prototype electronic system to devices mounted in socket areas 12 or 14, or to access nodes in the system for test and data acquisition purposes.

The FPCB 10 is linked to a host computer via an IEEE standard 1149.1 "JTAG" bus and a JTAG connector 28. The JTAG bus is distributed from connector 28 to all FPIDs on the FPCB 10. As described in detail hereinbelow, the JTAG bus carries data between the FPIDs and the host computer and permits the host computer to program the FPIDs to make the desired connections between components of the prototype system. The JTAG bus also enables the host computer to select various modes of operation of buffers within the FPIDs and to read out data stored in the FPIDs.

Figure 2:
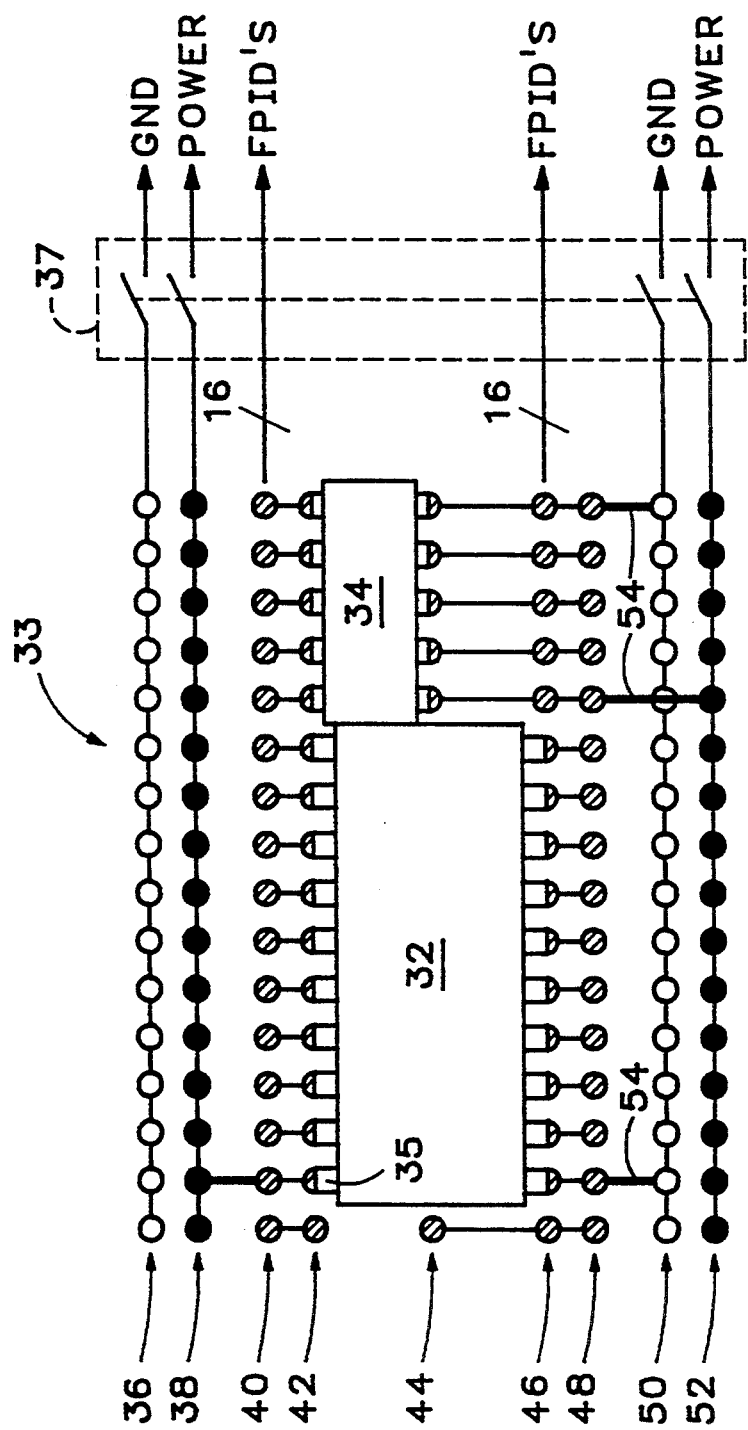
FIG. 2 illustrates the layout of a portion of the user's device socket area of FIG. 1.

FIG. 2 illustrates an array 33 of socket holes forming a portion of the left user's device socket area 12 of FIG. 1. (The right user's device socket area 14 is identical to the left.) The array 33 comprises parallel rows 36–52, each row 36–52 containing 16 socket holes. All holes of rows 36 and 50 are electrically interconnected to one another and are tied to ground via a manual switch 37. All holes of rows 38 and 52 are also connected to one another and to a power supply through switch 37. Adjacent holes of rows 40 and 42 are tied to one another and to I/O ports of separate FPIDs 24 of left cluster 20 (FIG. 1). Adjacent holes of rows 44, 46 and 48 are also connected to one another and to terminals of separate FPIDs 24 of left cluster 20 (FIG.1). A user may insert a pin of a device into any hole in rows 42, 44 or 46. Each hole of row 40 and each adjacent hole pair of rows 46 and 48 constitute a separate "socket" for receiving a pin of a user device, there being 924 such sockets in socket area 12 and each being linked to a separate input/output port of an FPID of left cluster 20.

The holes in each row are separated by 0.1 inch, rows 44 and 46 are spaced at 0.3 inch and 0.6 inch from row 42 in a particular example. The array 33 can accommodate various sizes of integrated circuits and other devices either by directly inserting the device pins in the holes or through adaptive sockets that may be mounted in the holes. In the example of FIG. 2, the user has mounted a pair of user-supplied integrated circuits 32 and 34 on array 33. Pins 35 along one side of each integrated circuit 32 and 34 are inserted into holes of row 42. Pins on the other sides of circuits 32 and 34 are inserted into holes of rows 46 and 48, respectively. The user has also installed a set of jumpers 54 to connect various pins on circuits 32 and 34 to power and ground on rows 38, 50 or 52. With integrated circuits 32 and 34 thus installed, microstrip wiring on the circuit board connects pins of each integrated circuit 32,34 to a separate input/output port of left FPID cluster 20 of FIG. 1.

Referring again to FIG. 1, microstrip lines between ports of FPIDs 24 and the right and left socket areas 12 and 14 are made in a distributed fashion to minimize the number of FPIDs required to link circuit component pins. 58 I/O ports of each FPID 24 in left cluster 20 are connected to sockets in left socket area 12 in a distributed fashion, the connections being evenly spread out over the socket area. Another 60 of the I/O ports of each FPID 24 in left cluster 20 are connected to ports of other FPIDs in the same cluster, 4 ports being connected to each of the other 15 FPIDs of the cluster. Of the remaining 42 ports of each FPID 24, one port is connected to ports of each of the 16 FPIDs 24 of right cluster 22, 14 are connected to pins on connector 16, 4 are connected to pins in probing area 29, and 8 are connected to various clock sources generated by clock generation circuits in area 26. The ports of FPIDs 24 of right cluster 22 are connected in a similarly distributed fashion to sockets in right socket area 14, to probing area 30, to connector 18, to one another, and to ports of FPIDs in left cluster 20.

The way in which FPID port connections are distributed, with relatively more connections to adjacent socket areas and to FPIDs in the same cluster, and with relatively fewer inter cluster connections, maximizes the efficiency with which prototype circuit device interconnections can be made. This is particularly true when the user mounts heavily interconnected devices in the same socket area. For example, when pins of two devices mounted in left socket area 12 are to be connected, the connection can often be made by way of only two FPIDs 24 in the left cluster 20. The ports of those FPIDs are distributed over the socket area and there is a relatively large number (4) of available interconnections between each pair of FPIDs of the same cluster.

Figure 3:
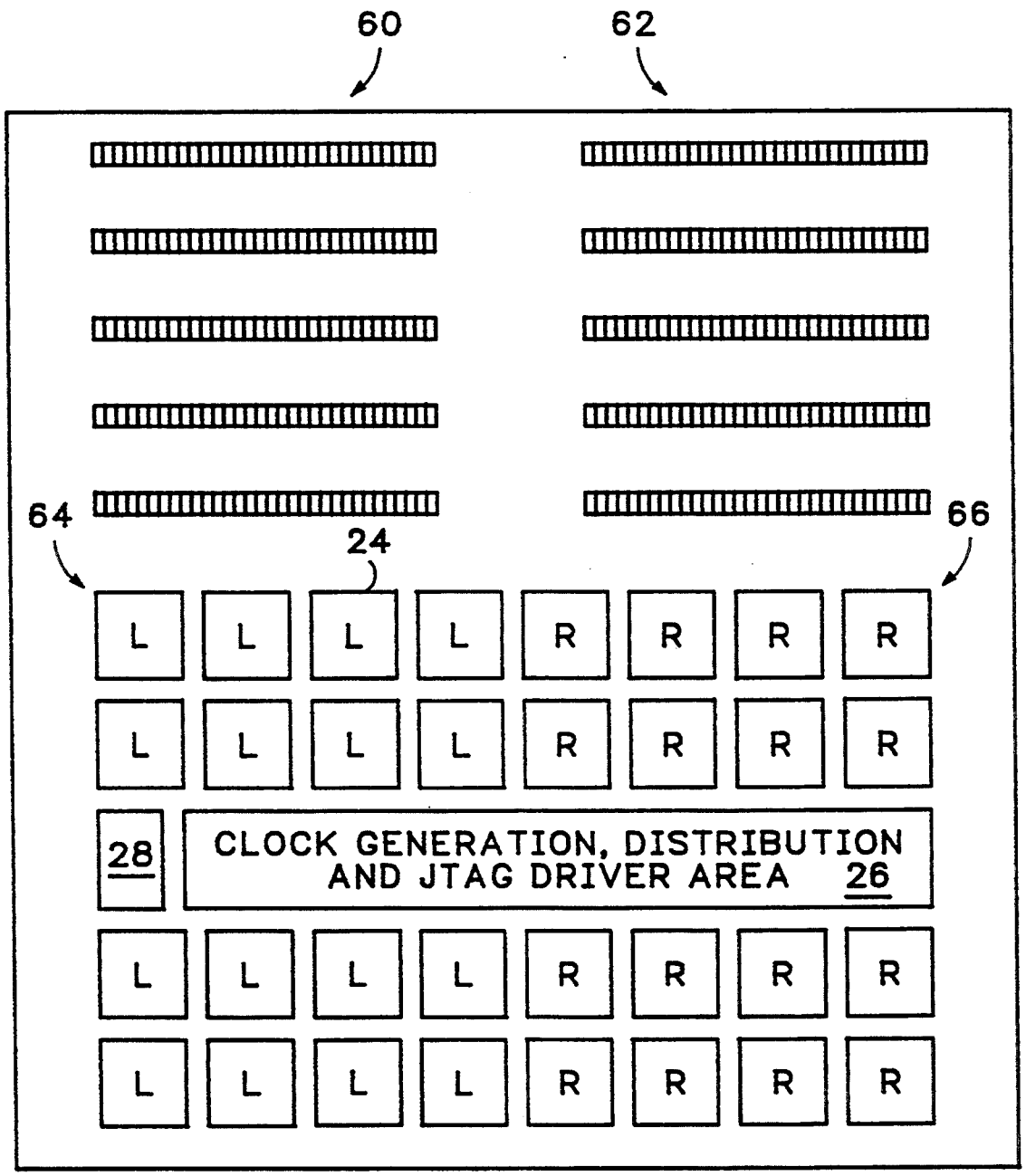
FIG. 3 illustrates a layout of a programmable mother board in accordance with the present invention.
Figure 4:
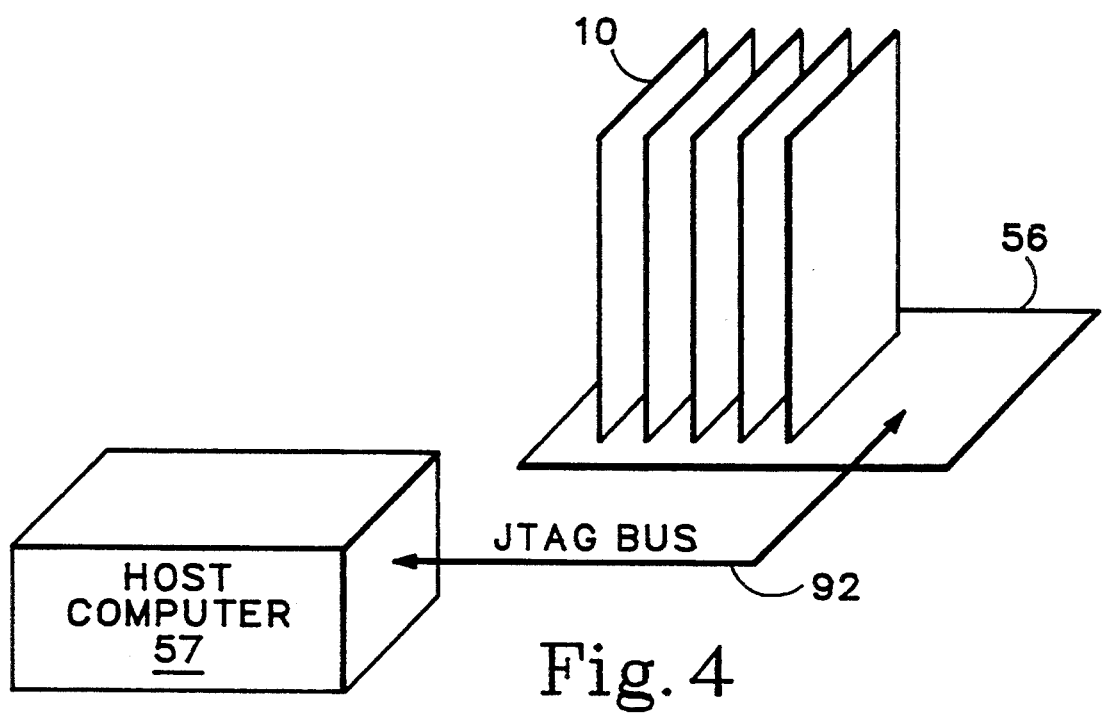
FIG. 4 is a diagrammatic perspective view of the programmable mother board of FIG. 3 on which are mounted five programmable circuit boards of FIG. 1.

FIG. 3 illustrates a layout of a mother board 56 for receiving five FPCBs 10 of FIG. 1. FIG. 4 illustrates the five FPCBs 10 installed on mother board 56. Mother board 56 includes left and right female edge connector sockets 60 and 62 for receiving the male edge connectors 16 and 18 of up to five FPCBs 10 of FIG. 1. Left (L) and right (R) clusters 20 and 22 of FPIDs 24 selectively interconnect pins of the FPCBs mounted in the sockets 60 and 62 to one another. FPIDs 24 and sockets 60 and 62 of the mother board of FIG. 3 are wired together in a distributed fashion in substantially the same manner as FPIDs 24 and holes of socket areas 12 and 14 are wired together.

The mother board is also linked to a host computer via the JTAG bus and a JTAG connector 28.

The JTAG bus is distributed from connector 28 to all FPIDs on the mother board. As described in detail hereinbelow, the JTAG bus carries data between the FPIDs and the host computer and permits the host computer to program the FPIDs to make desired connections and to select various modes of operation of buffers within the FPIDs and to read out data stored in the FPIDs.

Figure 5:
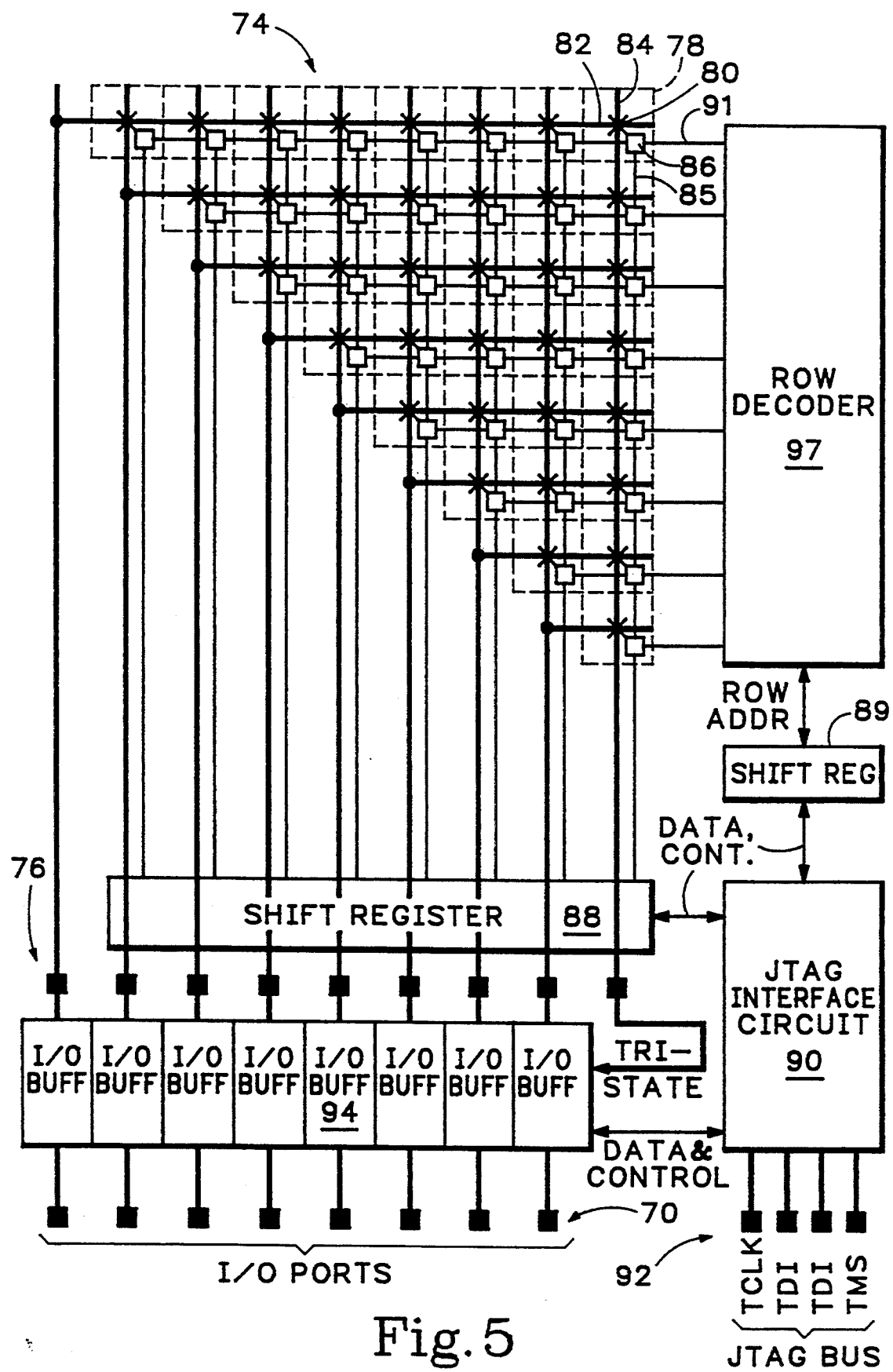
FIGS. 5 and 6 diagrammatically illustrate a field programmable interconnect device of FIG. 1 in block diagram form.

FIG. 5 illustrates an FPID 24 of FIG. 1 in simplified block diagram form. In the preferred embodiment of the invention, each FPID is a 208-pin integrated circuit. Of these 208 pins, 160 pins provide input/output ports 70 for signals to or from other parts of the FPCB 10 of FIG. 1. In FIG. 5, only 8 ports of the total 160 are shown. FPID 24 also includes a 176-port cross-point switch 74. Switch 74 can selectively connect any one of its 176 ports 76 to any one or more of its other ports. In FIG. 5, only 9 switch array ports 76 of the total 176 are shown. Switch 74 comprises a triangular array of 176 rows and columns of cross-point switch cells 78. (Only 8 rows and 9 columns are shown in FIG. 5.)

Each switch cell 78 consists of a switch 80 and a memory cell 86. Switch 80 selectively interconnects one horizontal signal line 82 with one vertical signal line 84. Memory cell 86 stores a single data bit and the state of the stored data bit controls the state of switch 80. When the stored bit is high, the switch connects the horizontal and vertical signal lines 82 and 84 passing through the cell but when the stored bit is low, the vertical and horizontal signal lines are disconnected. Each horizontal signal line 82 passes through all cells 78 of a separate array row, and each vertical signal line 84 passes through all cells 78 of a separate array column. Each one of the horizontal signal lines 82 and each one of the vertical signal lines 84 are hardwired to a corresponding one of the 176 array ports 76 of the cross-point switch 74.

By placing the appropriate data bits in the memory cells 86 of switch cells 78, any array port 76 may be connected to any other port or set of array ports 76. A separate data bit is concurrently supplied as input to the memory cells of each cell column through data outputs 85 of a 175-bit shift register 88. The JTAG interface circuit 90, responding to instructions from the host computer via the JTAG bus 92, shifts 175 data bits from the JTAG bus into shift register 88. JTAG interface circuit 90 also stores a row address received via the JTAG bus in a shift register 89. A row decoder 97 decodes the row address stored in shift register 89 to input enable the memory cells 86 of one row of switch cells 78 via one of memory control lines 91 supplied in parallel to each memory cell of a row so that each memory cell of the row stores a separate one of the 175 data bits from shift register 88. To program the entire switch, the process of storing data in shift register 88 and input enabling a row of memory cells is repeated for each of the 176 cell rows of the cross-point array. A set of 160 input/output buffers 94 interconnect the 160 FPID I/O ports 70 with 160 of the 176 array ports 76 of cross-point switch 74. Eight of the 176 array points 76 provide tristate control inputs TS0–TS7 to I/O buffers 94.

Figure 6:
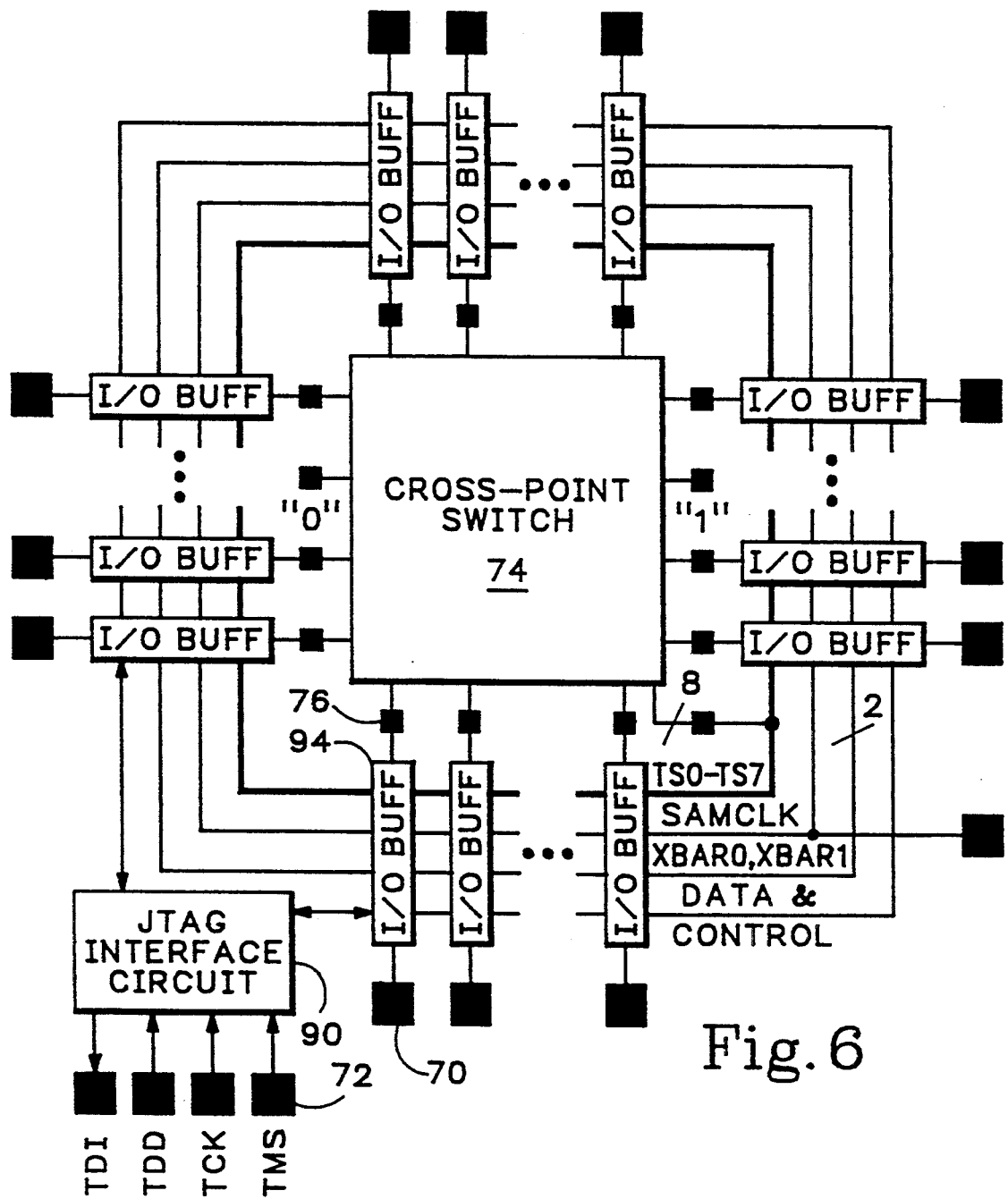

FIG. 6 also shows an FPID 24 in block diagram form. Shift registers 87 and 88 and row decoder 97 shown in FIG. 5 are omitted in FIG. 6. In FIG. 6, I/O buffers 94 are shown surrounding cross-point switch 74 and connecting FPID I/O ports 70 to ports 76 of cross-point switch 74. High ("1") and low ("0") logic levels drive an additional pair of cross-point switch array ports 76. Eight ports 76 of switch 74 drive tristate control lines TS0–TS7 connected in parallel to each of I/O buffers 94 and a clock signal SAMCLK applied to another I/O port 70 is connected in parallel to each I/O buffer 94 to control data sampling in a manner described hereinbelow. A pair of "outer cross-bar" lines XBAR0 and XBAR1 is also connected in parallel to all I/O buffers 94. Switches in each buffer 94 can be programmed to connect their pin side port 70 to either the XBAR0 or XBAR1 wherein the XBAR1 and XBAR0 lines facilitate testing of the FPID. The JTAG bus signal lines TDI, TDO, TCK and TMS are tied to four pins 72 connected to JTAG interface circuit 90. Control and data outputs of interface circuit 90 are connected in parallel and serial fashion to all of the I/O buffers 94.

Figure 7:
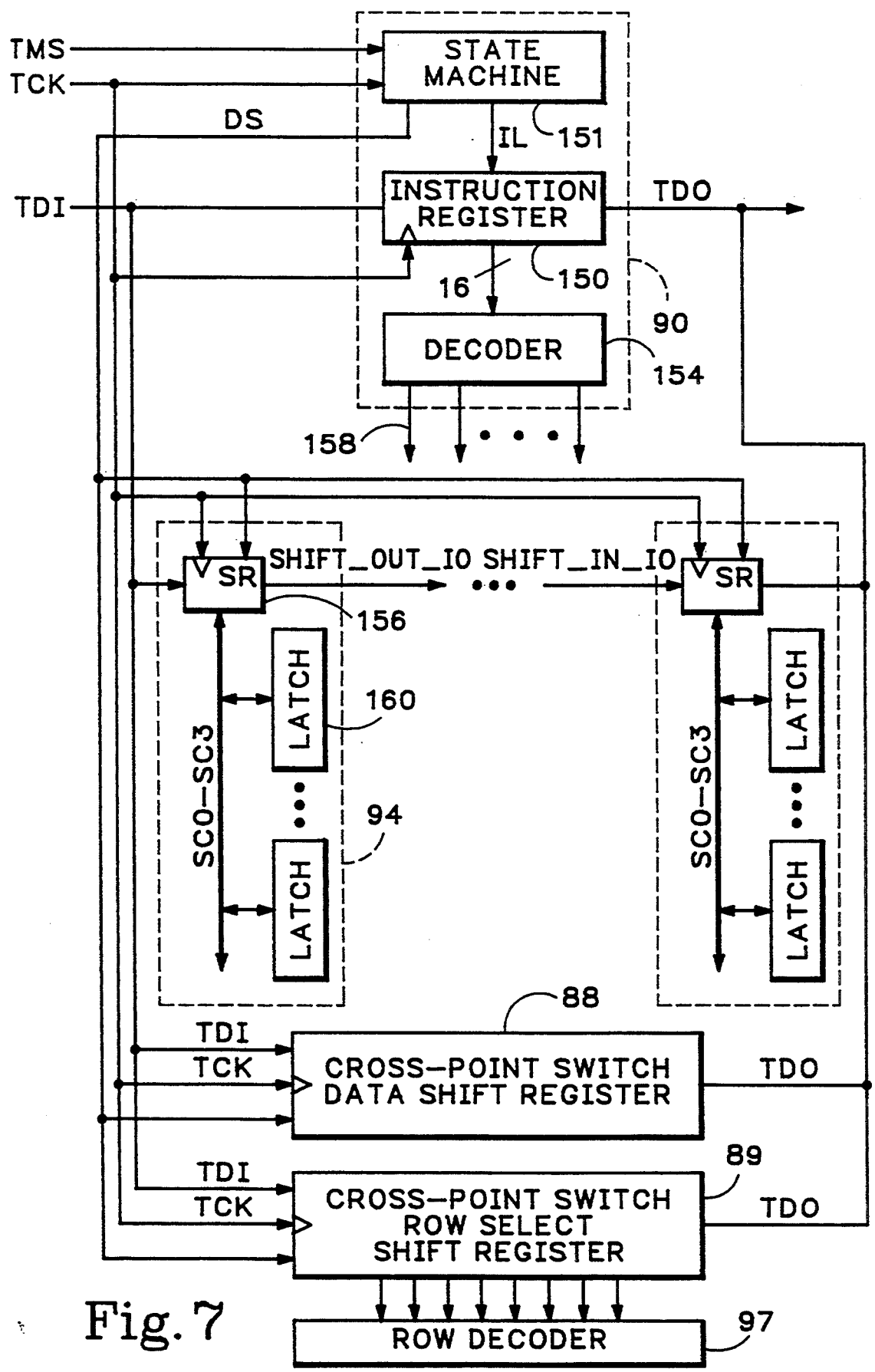
FIG. 7 is a block diagram of a JTAG interface circuit.

FIG. 7 illustrates the JTAG interface circuit 90 of FIG. 6. The JTAG bus arrives at the FPCB through connector 28 of FIG. 1 and drivers in area 26 forward the JTAG bus to every FPID on the board, the IEEE standard JTAG bus being intended for transmitting and sending serial data to and from digital circuit boards and being synchronously controlled by the host computer through a commercially available interface. Through the JTAG interface circuit 90, the host computer can program the FPIDs to make the desired connections between devices mounted in socket areas 12 and 14, edge connectors 16 and 18, and probing areas 29 and 30 of FIG. 1. Each FPID 24 port selectively provides any of several types of buffering. The host computer uses the JTAG interface circuit 90 to select the type of buffering provided by each port and each FPID can introduce an adjustable amount of port-to-port delay in signals passing through the device. The host computer also uses the JTAG interface to select the desired delay. Each FPID 24 also stores a record of the last 16 data bits appearing at each of its 160 ports and this type of data helps a user to understand the operation of the prototype electronic system. The JTAG interface circuit permits the host computer to access and display that data. The four JTAG lines are Test Data In (TDI), Test Data Out (TDO), Test Clock (TCK) and Test Mode Select (TMS). All devices on the bus (i.e. all FPIDs) are connected in series with the TDO pin of one device connected to the TDI pin of the next while the TDI and TDO pins of the first and last devices are tied to the host computer.

The TMS signal is supplied as input to a state machine 151 clocked by the TCK signal. The TMS signal indicates whether the JTAG bus is in an instruction loading or data shifting phase of operation. State machine 151 operates as indicted by the IEEE JTAG bus standard 1149.1 to produce two signals IL and DS. The state machine asserts the IL signal during the instruction loading phase and asserts the DS signal during the data shifting phase of JTAG bus operation.

During the instruction loading phase, the host computer shifts a 16-bit instruction via the TDI line into a serial instruction register 150 in the JTAG interface circuit 90 that is input enabled by the IL signal from state machine 151. The TCK signal clocks the instruction data into register 150. This instruction is decoded by a decoder 154 which supplies read or write control signals 158 to latches, buffers and other devices within the FPIDs 24 on the FPCB. The data stored in these devices controls FPID operation.

The control signals produced by decoder 154 select devices 160 in FPID I/O buffers 94 to read or write access a 4-bit bus SC0-SC3 connected to a parallel input of a 4-bit shift register 156, also included in each FPID I/O buffer 94. The 4-bit shift registers 156 of all FPID I/O buffers are connected in series. During a data shifting phase of bus operation, when the shift registers 156 are enabled by the DS output signal of state machine 151 and are selected by output signals 158 of decoder 154, the host computer can serially shift data into all shift registers 156 via the TDI line and can read data shifted out of these registers via the TDO line. The data stored in the latches and other devices 160 connected to the SC0-SC3 bus controls FPID operation.

The read/write control signal outputs of instruction decoder 154 may also select cross-point switch data shift register 88 or row select shift register 89 to receive data from the JTAG bus when input enabled by the DS signal during a data shift phase of the bus. Shift register 88 (also seen in FIG. 5) supplies the switch control data to the cross-point switch. The row select shift register 89 supplies the row address to row decoder 97, shown in FIG. 5.

Figure 8:
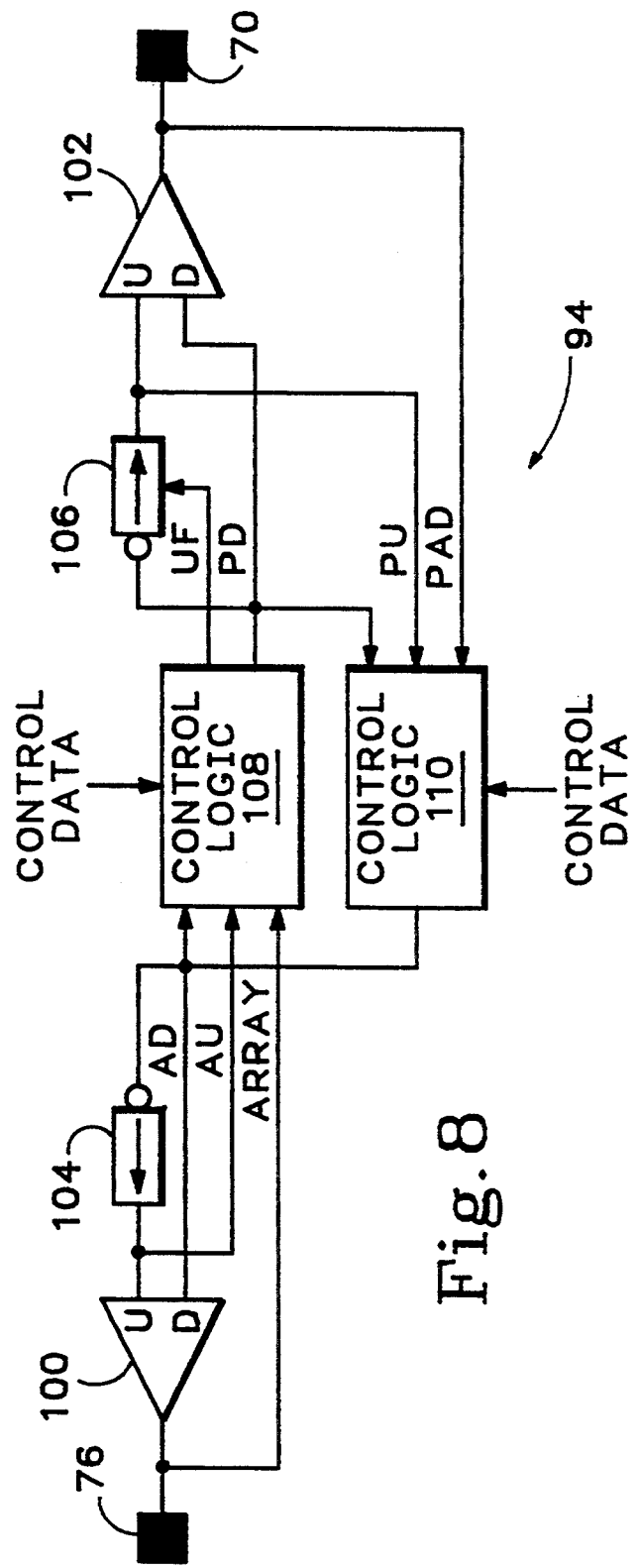
FIGS. 8 and 9 diagrammatically illustrate an I/O buffer of FIGS. 5 and 6 in block diagram form.

FIG. 8 illustrates an I/O buffer 94 of FIG. 6 in simplified block diagram form. I/O buffer 94 includes an output buffer 100 for driving the array port 76 and an output buffer 102 for driving the I/O port 70. The output AU of a single-shot device 104 controls a pull-up input U of buffer 100 while the output PU of another single-shot device 106 controls the pull-up input U of buffer 102. The output PD of a control logic circuit 108 drives the single-shot device 106 and the pull-down input D of buffer 102. Similarly, the output AD of another control logic circuit 110 drives the single-shot device 104 and the pull-down input D of buffer 100. The output of single-shot device 106 is forced high when a UF output of control logic circuit 108 is high. Inputs to control logic circuit 108 include AU, AD and the signal ARRAY on array port 76 from the cross-point switch array. Inputs to control logic circuit 110 include PU, PD and the signal PAD at I/O port 70, an external pin of the FPID.

In response to control data supplied to control logic circuits 108 and 110, the I/O buffer 94 can operate in one of eleven different modes as follows:

UNIDIRECTIONAL INPUT (UI)

In this mode the circuit passes data signals in one direction from I/O port 70 to cross-point array port 76. Logic circuit 108 and single-shot device 106 hold PD and PU low so that buffer 102 does not pull up or down on PAD. Logic circuit 110 drives AD low when PAD is high so that an AU pulse from single-shot device 104 causes buffer 100 to pull up ARRAY. Trickle charges in buffer 100 hold ARRAY up after the PU pulse goes away. LOGIC circuit 110 drives AD high when PAD is low so that buffer 100 pulls down ARRAY.

UNIDIRECTIONAL INVERTED INPUT (UII)

In this mode the circuit inverts signals at I/O port 70 and passes them to cross-point array port 76. Logic circuit 108 and single-shot device 106 hold PD and PU low so that buffer 102 does not pull up or down on PAD. Logic circuit 110 drives AD low when PAD is low so that an AU pulse from single-shot device 104 causes buffer 100 to pull up ARRAY. Trickle charges in buffer 100 hold ARRAY up after the PU pulse goes away. LOGIC circuit 110 drives AD high when PAD is high so that buffer 100 pulls down ARRAY.

UNIDIRECTIONAL OUTPUT (UO)

In this mode the circuit passes data signals in one direction from cross-point array port 76 to I/O port 70. Logic circuit 110 and single-shot device 104 hold AU and AD low so that buffer 100 does not pull up or down on ARRAY. Logic circuit 108 drives PD low when ARRAY goes high. Single-shot device responds by pulsing PD causing buffer 102 to pull up PAD, and trickle charges in buffer 102 hold PAD up thereafter. Logic circuit 108 drives PU low when ARRAY is low so that buffer 102 pulls down PAD.

BI-DIRECTIONAL BUFFER (BDR)

In this mode the circuit passes data signals in either direction between I/O port 70 and cross-point array port 76 depending on which signal ARRAY or PAD is externally driven. In this mode control logic circuits 108 and 110 act like three-input NOR gates. In the quiescent state, when neither port is externally driven, trickle charges in buffers 100 and 102 hold both PAD and ARRAY high. Control logic circuits 108 and 110 hold PD and AD low and single-shot devices 104 and 106 hold PU and AU low. When an external device pulls ARRAY low, control logic circuit 108 turns on PD thereby causing buffer 102 to pull down PAD. When the external device releases ARRAY, trickle charges in buffer 100 pull up on array and control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low, control logic circuit 110 pulls up AD thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter trickle charges in buffer 100 continue to hold ARRAY up.

TRISTATE UNIDIRECTIONAL INPUT (TUI)

In this mode the circuit passes data signals in one direction from I/O port 70 to cross-point array port 76 when a tristate input signal TS to control logic circuit 110 is held high. Logic circuit 108 and single-shot device 106 always hold PD and PU low so that buffer 102 does not pull up or down on PAD. Logic circuit 110 and single-shot device 104 normally hold AD and AU low when TS is low. When TS and PAD are driven high, logic circuit 110 drives AD low. Single-shot device 104 responds by pulsing AU so that buffer 100 pulls up ARRAY. Trickle charges in buffer 100 hold ARRAY up thereafter. When TS is high and PAD is driven low, logic circuit 110 drives AU low so that buffer 100 pulls down ARRAY.

TRISTATE UNIDIRECTIONAL INVERTED INPUT (TUII)

In this mode the circuit inverts data signals at I/O port 70 and passes them to cross-point array port 76, provided tristate input signal TS to control logic circuit 110 is held high. Logic circuit 108 always holds PU and PD low so that buffer 102 does not pull up or down on PAD. Logic circuit 110 normally holds AD and AU low when TS is low. When TS and PAD are driven high, logic circuit 110 drives AU low and AD high so that buffer 100 pulls down ARRAY. When TS is high and PAD is low, logic circuit 110 drives AU high and AD low so that buffer 100 pulls up ARRAY.

TRISTATE UNIDIRECTIONAL OUTPUT (TUO)

In this mode the circuit passes data signals in one direction from cross-point array port 76 to I/O port 70 when the tristate input signal TS to control logic circuit 108 is held low. Logic circuit 110 and single-shot device 104 always hold AD and AU low so that buffer 100 does not pull up or down on ARRAY. In the quiescent state, when TS is high, logic circuit 108 and single-shot device 106 hold PU and PD low so that buffer 102 does not control PAD. When TS is driven low and ARRAY is driven high, logic circuit 108 drives PD low. Single-shot device 106 pulses PU so that buffer 102 pulls up PAD. Trickle charges in buffer 102 hold up PAD thereafter. When TS is low and ARRAY is low, logic circuit 108 drives PD high so that buffer 102 pulls down PAD.

TRISTATE BI-DIRECTIONAL BUFFER (TBDR)

In this mode the circuit passes data signals in either direction between I/O port 70 and cross-point array port 76 depending on which signal, ARRAY or PAD, is externally driven, provided the tristate input signal TS is high for input and low for output. In the quiescent state, when neither port is externally driven, trickle charges in buffers 100 and 102 hold PAD and ARRAY up. Control logic circuits 108 and 110 hold PD and AD low. Single-shot devices 104 and 106 hold PU and AU low. When an external device pulls ARRAY low in the presence of a low tristate control signal TS, control logic circuit 108 turns on PD thereby causing buffer 102 to pull down PAD. When the external device releases ARRAY, trickle charges in buffer 100 pull ARRAY back up. Control logic circuit 108 responds by pulling PD down. The falling edge of PD causes single-shot device 106 to pulse PU high, thereby causing buffer 102 to quickly pull up PAD. Thereafter trickle charges in buffer 102 continue to hold PAD up. When an external device pulls PAD low while TS is high, control logic circuit 110 pulls up AD, thereby causing buffer 100 to pull down ARRAY. When the external device releases PAD, trickle charges in buffer 102 pull PAD back up. Control logic circuit 110 then pulls AD down, and the falling edge of AD causes single-shot device 104 to pulse AU high. Buffer 100 then briefly pulls up ARRAY. Thereafter trickle charges in buffer 100 continue to hold ARRAY up.

FORCE LOGIC "1" OUTPUT (FL10)

In this mode control logic circuit 108 holds PD low and holds UF high. The high UF signal drives up the PU output of single-shot device 106 which causes buffer 102 to pull up PAD.

FORCE LOGIC "0" OUTPUT (FL00)

In this mode control logic circuit 108 holds PD high, thereby causing buffer 102 to pull down PAD regardless of the state of ARRAY.

NO CONNECT (NC)

In this mode control logic circuit 108 drives PD low and control logic circuit 110 drives AD low so that the outputs of buffers 100 and 102 float.

In any mode where signals pass from array port 76 to I/O port 70, the I/O buffer 94 of FIG. 8 will delay signal transfer by 0, 20, 40 or 60 nanoseconds as determined by control data supplied control logic circuit 108. Logic circuit 108 delays change in state of its PD output signal accordingly.

Figure 9:
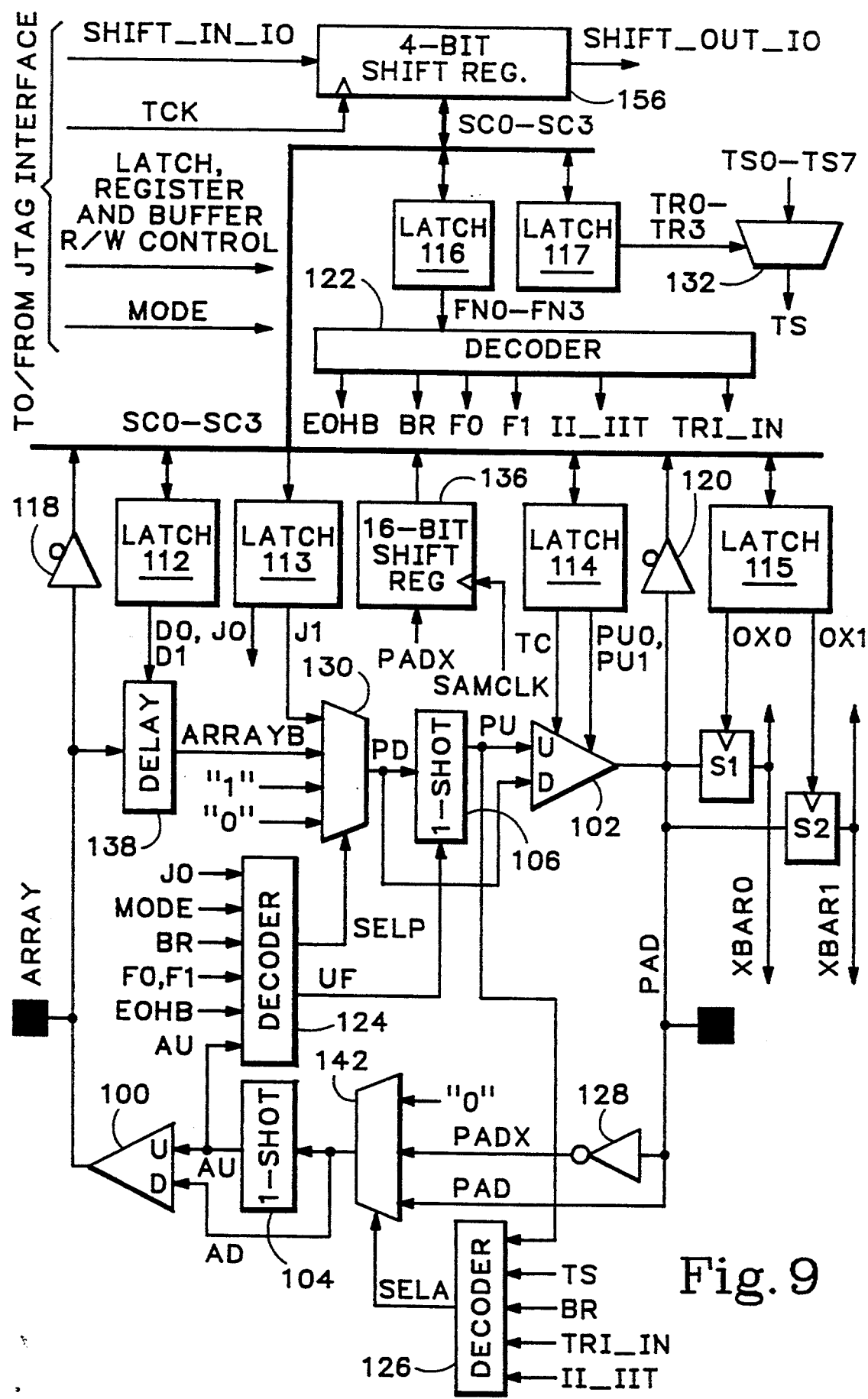

FIG. 9 depicts an I/O buffer 94 of FIG. 6 in more detailed block diagram form to illustrate the contents of control logic blocks 108 and 110 and to illustrate additional features of the buffer not apparent in FIG. 8. The I/O buffer includes a 4-bit shift register 156 that shifts in a data signal SHIFTINIO and shifts out a data signal SHIFTOUTIO. Shift registers of all I/O buffers are connected in series with the SHIFT OUT IO signal of one I/O buffer providing the SHIFTINIO signal to the next of the series. The JTAG interface circuit 90 of FIG. 6 supplies the JTAG signal TDI as the SHIFTINIO to the first buffer of the series, and connects the SHIFTOUTIO signal of the last buffer of the series to JTAG TDO line. The TCK JTAG signal clocks shift register 156 and a control signal from the JTAG controller input enables register 156.

The host computer may load control data into the shift registers 156 of all I/O buffers via the JTAG bus. One or more of the four data bits SC0–SC3 stored in shift register 156 are supplied as inputs to a set of latches 112–117, any one of which may be write enabled by the host computer via the JTAG interface. The following control data is supplied to latches in the I/O buffer via shift register 156:

D0,D1

These bits are stored in latch 112 and control the amount of signal delay passing through the buffer.

J0,J1

These bits are stored in latch 113 and are used to control the state of output buffer 102 when a MODE signal from the JTAG controller is asserted.

TC,PU0,PU1

These bits are stored in latch 114. The TC bit controls the maximum positive output swing (3 or 5 volts) of buffer 102 for compatibility with CMOS or TTL devices. The PU0 and PU1 bits switch output current sources (3, 17 or 20 mA) in buffer 102.

OX0,OX1

These bits are stored in latch 115 and control a pair of switches S1 and S2 for selectively connecting the PAD output of buffer 102 to the XBAR0 and XBAR1 outer crossbar transfer gates.

FN0–FN3

These bits are stored in latch 116 and select the operating mode of the buffer: unidirectional input, unidirectional inverted input, unidirectional output, bi-directional buffer, tristate unidirectional input, tristate unidirectional inverted input, tristate unidirectional output,-tristate bi-directional buffer, force logic "1" output, force logic "0" output or no connect.

TR0-TR3

These bits stored in latch 117 control a multiplexer 132 that selects the particular one of eight lines TS0-TS7 to be employed as tristate control signal TS for the buffer.

Control logic circuit 108 of FIG. 8 is implemented by the combination of decoders 122 and 124, a multiplexer 130 and a variable delay circuit 138. The ARRAY signal delayed by a variable amount of time is supplied as an ARRAYB input to multiplexer 130. Delay circuit 138 delays the ARRAY signal by 0, 10, 20 or 30 nanoseconds depending of the state of the D0,D1 bits stored in latch 112. A logic "0", a logic "1" and the J1 bit stored in latch 113 are also supplied as inputs to multiplexer 130. The output of multiplexer 130 is PD signal supplied as input to single-shot device 106 and to the pull-down input of buffer 102. As discussed below, decoder 124 decodes several input signals from decoder 122 and elsewhere to produce an output signal SELP that controls the switching state of multiplexer 130. Decoder 124 also produces the UF signal that can force up the PD output of single-shot device 106.

Control logic circuit 110 of FIG. 8 is implemented by the combination of decoders 122 and 126, an inverter 128 and a multiplexer 142. The PAD signal is inverted by inverter 128 to produce a PADX signal. PADX and PAD are supplied as inputs to multiplexer 142 and a "0" logic level is tied to another input of multiplexer 142. Multiplexer 142 selects one of its inputs as the AD output applied to the pull-down D input of buffer 100 and to the input of single-shot device 104. As discussed below, decoder 126 decodes several input signals to produce a signal SELA that controls multiplexer 142.

Decoder 122 decodes the mode control bits FN0-FN3 from latch 116 and a MODE signal from the JTAG controller to produce the following signals used locally within the buffer:

EOHB

This signal, when not active, tells decoder 124 to select the 0 logic level input to multiplexer 130. This causes PD and PU to remain low so that buffer 102 can neither pull up nor pull down PAD. When EOHB is active, decoder 124 can select an input to multiplexer 130 that may drive PD up. Decoder 122 asserts EOHB when the FN0-FN3 bits indicate the I/O buffer is in the unidirectional output mode, in the bi-directional buffer mode or in the tristate bi-directional buffer mode.

BR

This signal tells decoders 124 and 126 when the I/O buffer is to operate in one of the bi-directional buffer modes. When BR is asserted, decoder 124 switches multiplexer 130 to select the output of delay circuit 138 (unless inhibited by AU) and decoder 126 switches multiplexer 142 to select its PAD input (unless inhibited by PU).

TRI_IN

This signal tells decoder 126 that the I/O buffer is in one of the tristate modes. When TRI_IN is asserted, decoder 126 tells multiplexer 142 to select its "0" input unless the tristate control signal TS is asserted. When TS is asserted, decoder 126 tells multiplexer 142 to select the PAD input.

II_IIT

This signal is asserted when the I/O buffer is in one of the inverting modes and causes decoder 126 to switch multiplexer 142 to select its PADX input.

F0

This signal is asserted when the I/O buffer is in the force "0" logic output mode. It tells decoder 124 to select the logic "1" input to multiplexer 130, thereby driving up the PD input to buffer 102 and pulling down its output PAD.

F1

This signal is asserted when the I/O buffer is in the force "1" logic output mode. It tells decoder 124 to assert its UF output to force up the output PU of one shot device 106. This causes buffer 102 to drive PAD high.

The following is a truth table for decoder 124. An "X" indicates the signal is asserted, an "0" indicates the signal is not asserted and a "-" means signal state is not relevant.

TABLE I

| MODE OF OPER-ATION | INPUTS | | | | | OUTPUTS | |
|---|---|---|---|---|---|---|---|
| | F0 | F1 | BR | MODE | EOHB | SELP | UF |
| UI | O | O | O | O | O | "0" | O |
| UII | O | O | O | O | O | "0" | O |
| UO | O | O | O | O | X | ARRAYB | O |
| BDR | O | O | X | O | X | ARRAYB* | O |
| TUI | O | O | O | O | O | "0" | O |
| TII | O | O | O | O | O | "0" | O |
| TUO | O | O | O | O | X | ARRAYB | O |
| TBDR | O | O | X | O | X | ARRAYB* | O |
| FL1O | O | X | — | O | — | "0" | X |
| FL0O | X | O | — | O | — | "1" | O |
| NC | O | O | X | O | O | "0" | O |
| ANY MODE | — | — | — | X | — | J1 | J0 |

*AU when asserted requires SELP selection of "0" in the bi-directional buffer modes.

The following is a truth table for decoder 126. An "X" indicates the signal is asserted, an "0" indicates the signal is not asserted and a "__" means signal state is not relevant.

TABLE II

| MODE OF OPERA-TION | INPUTS | | | | OUTPUT |
|---|---|---|---|---|---|
| | TS | BR | TRI_IN | II_II | SELA |
| UI | — | O | — | O | PADX |
| UII | — | O | O | X | INVERSE PADX |
| UO | O | X | X | "0" | |
| BDR | — | X | O | — | PADX* |
| TUI | X | O | X | O | PADX |
| TII | X | O | X | X | INVERSE PADX |
| TUO | O | X | X | — | "0" |
| TBDR | X | X | X | — | PADX* |
| FL1O | O | X | X | — | "0" |
| FL0O | X | X | X | — | "0" |
| NC | O | X | X | — | "0" |

*PD when asserted requires "0" as SELB output in the bi-directional buffer modes.

The following is a truth table for decoder 122. An "X" indicates the signal is asserted, an "0" indicates the signal is not asserted.

TABLE III

| INPUT | OUTPUTS | | | | | |
|---|---|---|---|---|---|---|
| FN0–FN3 | EOHB | BR | F0 | F1 | IL_IIT | TRI_IN |
| UI | O | O | O | O | O | O |
| UII | O | O | O | O | X | O |
| UO | X | O | O | O | O | O |
| BDR | X | X | O | O | O | O |
| TUI | O | O | O | O | O | X |
| TII | O | O | O | O | X | X |
| TUO | X | O | O | O | O | O |
| TBDR | X | X | O | O | O | O |
| FL1O | O | O | O | X | O | O |
| FL0O | O | O | X | O | O | O |
| NC | O | X | O | O | O | O |

Figure 10:
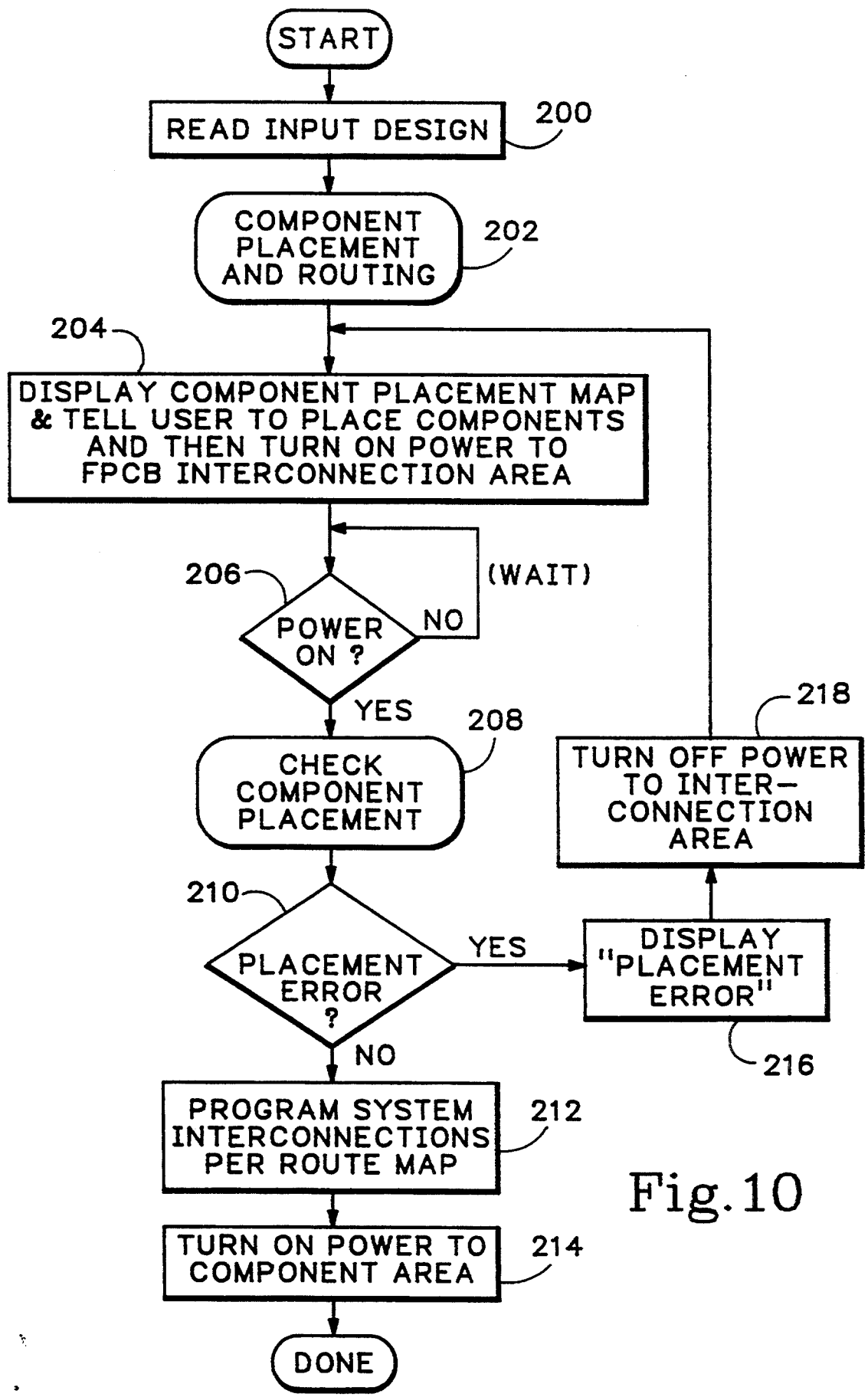
FIGS. 10–14 are flow charts describing operation of the host computer of FIG. 4.

FIGS. 10–14 are flow charts illustrating software operation of the host computer of FIG. 5 for programming the FPCB via the JTAG bus. Referring to FIG. 10, the host computer initially reads a data file provided by the user (step 200). The data file includes a standard net list describing the system to be assembled in terms of the nature of the input, output, power and ground pins of each device to be mounted in the socket areas of the FPCBs or connected to the probing areas, and how they are interconnected. The data file also includes information indicating the packaging of the devices to be mounted in the socket areas including pin arrangement and spacing.

The host computer then executes a subroutine (step 202) to determine how to place the components in the socket areas of one or more FPCBs, where each external device should be connected to the probing areas, and how to program the FPIDs to make the necessary connections. The host computer then displays a component placement map showing how the user should place each component in the socket areas, how to jumper ground and power strips to device sockets, and where to connect the external devices to the probing areas (step 204). At that point the host computer tells the user to supply power to the FPIDs when the user has mounted or connected the components.

When, via the JTAG interface, the host computer determines the power to the FPIDs is on (step 206), it executes a subroutine (step 208) by means of which it tests whether the user has properly installed the components in the socket areas. If the host computer determines that placement is not correct (step 210), it displays a "placement error" notice to the user (step 216), turns off power to the FPIDs (step 218) and re-displays the component placement map (step 204). However, if the host computer determines component placement is correct (step 210), it programs the FPIDs (step 212) according to the routing map generated in step 202. Thereafter it turns on power to the socket areas of the FPCBs so that operation of the prototype electronic system can commence (step 214).

Figure 11:
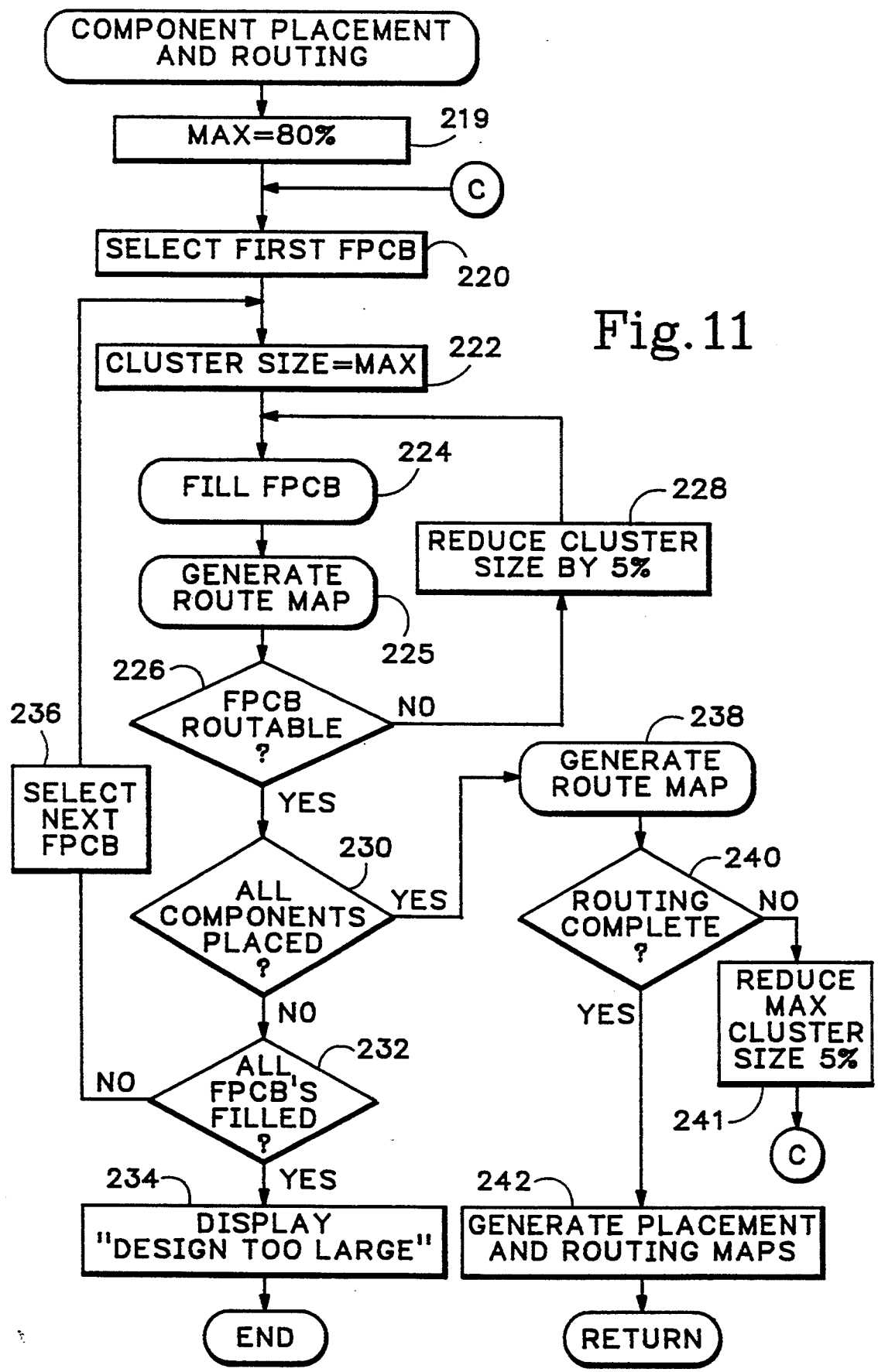

FIG. 11 illustrates the component placement and routing subroutine of FIG. 10. The subroutine initially sets a MAX parameter to equal 80% (step 219), selects a first FPCB (step 220), and then sets a "cluster size" parameter equal to MAX (step 222). The cluster size parameter indicates the percentage of holes in each socket area to be filled with component pins. The routine calls a subroutine (step 224) that chooses components to be placed on the selected FPCB and assigns them a placement location. The routine then calls another subroutine (step 225) that attempts to generate a routing map for the selected FPCB. If the routine determines (step 226) there are insufficient FPID resources to make the necessary interconnections within the selected FPCB, the cluster size is reduced by 5% (step 228) and the FILL FPCB subroutine (step 224) is repeated. Since the cluster size has been reduced, the number of components placed on the selected FPCB will likely also be reduced and this reduces the demand for FPID interconnection resources. The loop through steps 224, 225, 226 and 228 is repeated until the number of devices mounted on the FPCB is small enough to be properly interconnected.

At that point (step 230) the routine checks whether all components have been assigned a mounting position on an FPCB. If not, the routine selects another FPCB (step 236), resets the cluster size to MAX (step 222) and fills the selected circuit board with more components (steps 224, 226, 228). The process of placing components on FPCBs is repeated until the routine finds that all FPCBs have been filled (step 232) or until it finds that all components have been placed (step 230). If the routine finds that all FPCBs have been filled (step 232), it displays a message "Design too large", and the routine terminates. This indicates that the system the user has described in the input data is too large to be interconnected by the FPCBs available.

If, however, the system being interconnected is not too large, then when all components have been assigned to FPCBs (step 230), the routine attempts to generate a routing map for the necessary connections on the mother board to interconnect the various FPCBs (step 238). If the mother board does not have sufficient routing resources (step 240), the routine reduces maximum cluster size by 5% (step 241) and repeats the entire process starting at step 220. This reduces the number of components on each FPCB to make it easier to complete routing on the mother board. When at step 240 it is determined that mother board routing can be completed, the routine generates routing and placement maps (step 242) and returns to the calling routine.

Figure 12:
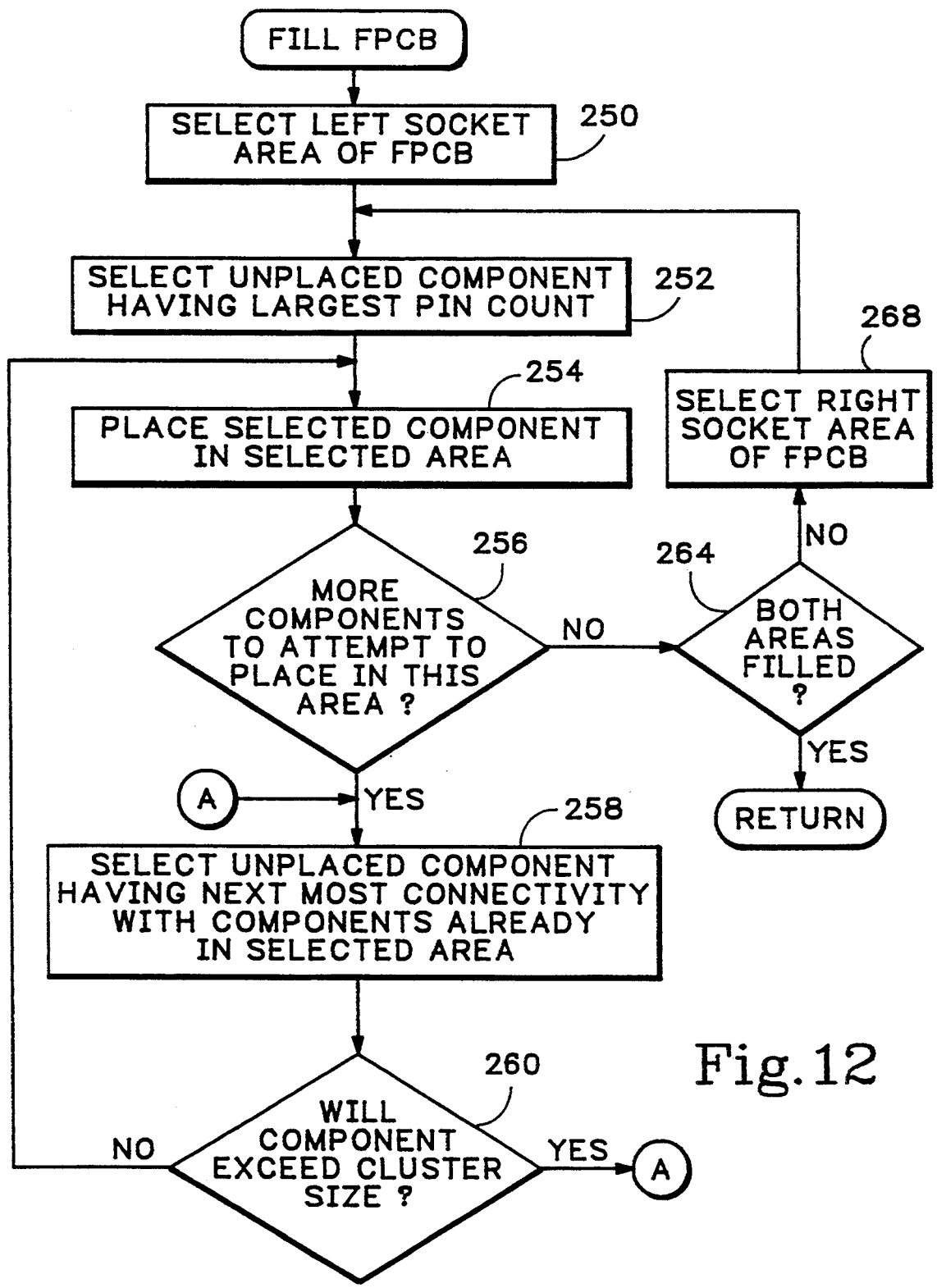

FIG. 12 illustrates the FILL FPCB subroutine called at step 224 of FIG. 11. The subroutine initially selects the left socket area of the currently selected FPCB (step 250). The subroutine then selects the largest unplaced component from a list of components not yet placed on a FPCB, that is, it selects the unplaced component having the largest number of pins. It then assigns the component a position in the selected socket area (step 254) and checks whether any more components remain to be placed (step 258). If there are, then the subroutine selects the unplaced component having the "most connectivity" with components already assigned to the socket area (step 258). That is, it selects the unplaced component that requires the greatest number of connections with other components already placed in the socket area. If the selected component will fit in the socket area (step 260), then the selected component is placed in the socket area (step 254) and the process of selecting additional component for the socket area is repeated. If at step 260 the component will not fit in the socket area, this component is not assigned to the socket area, and the routine reverts to step 258, selects another component and attempts to place it in the socket area.

When at step 256 the subroutine determines that it has atempted to place all unplaced components in the socket area, it determines whether it has filled both socket areas of the FPCB (step 264). If not, it selects the right socket area and repeats te process (steps 252-260) of filling that socket area with components. When it has assigned components to both socket areas (step 264), the subroutine returns to its calling routine.

Figure 13:
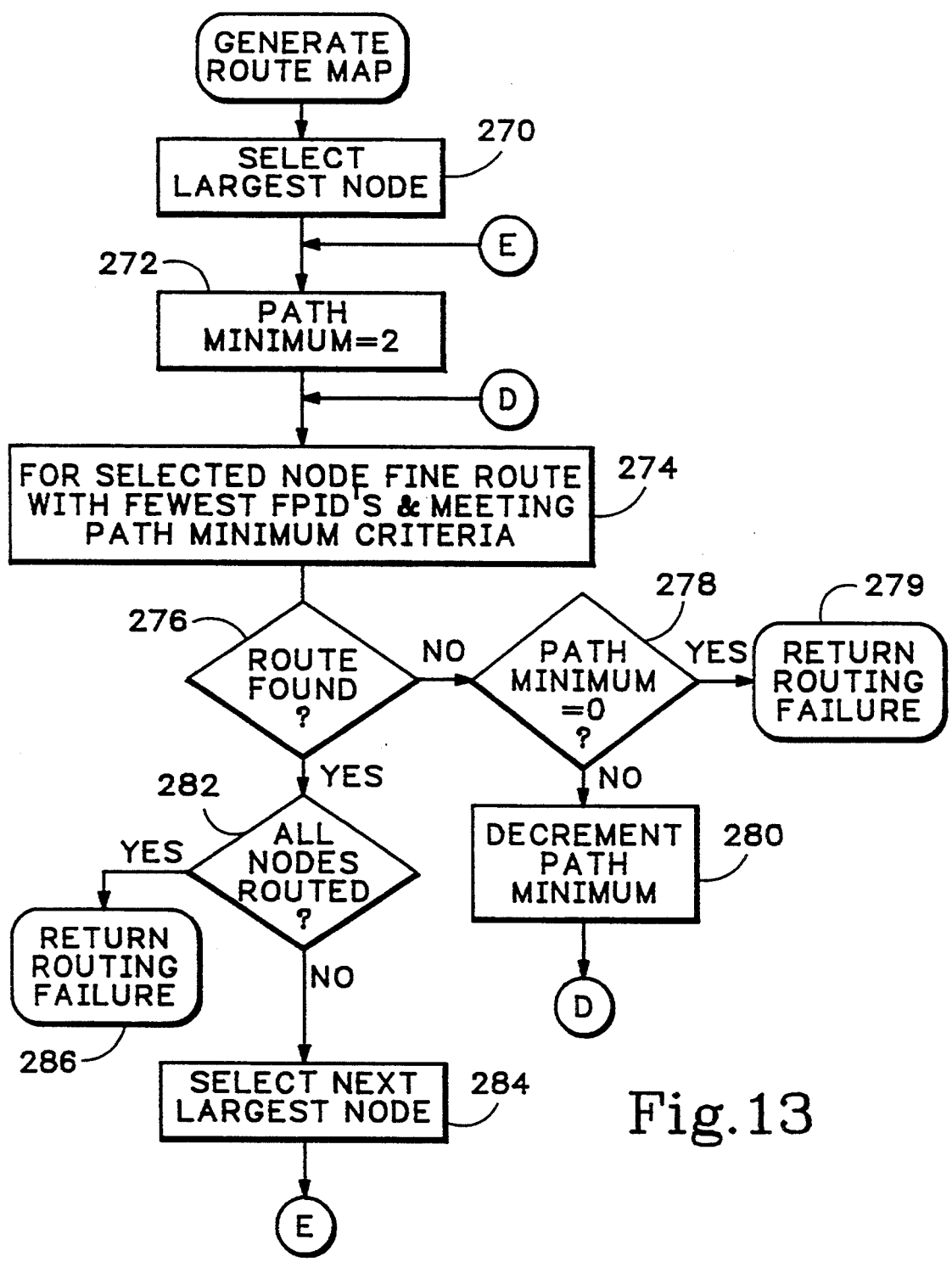

FIG. 13 illustrates the GENERATE ROUTE MAP routine called at steps 225 and 238 of FIG. 11. The GENERATE ROUTE MAP routine represents a circuit being interconnected as a set of nodes. Each "node" is the set of all device pins in a circuit that must be logically tied together. A route is a set of FPIDs and their interconnecting wires that can tie together a circuit node. since FPIDs are interconnected in many ways, there are many possible routes for each node. But in order to use th FPCB routing resources efficiently, the GENERATE ROUTE MAP routine attempts to select the routes requiring the fewest number of FPIDs. However, as it routes each node in succession, the routine tries not to choose routes that use up all of the available wires between any two FPIDs. This helps to reserve paths for nodes not yet routed.

The routine first (step 270) selects the largest node of the circuit. The largest node is the node connecting the most device terminals. The routine then sets a PATH MINIMUM parameter equal to 2 (step 272). For the selected node, the routine next searches for the route requiring the smallest number of FPIDs, provided the route also satisfies a path minimum criteria (step 274). To satisfy the path minimum criteria, the routine must not route the node between two FPIDs unless the number of unused connections between those two FPIDs is 2 or more. This helps ensure that at least one wire between these two FPIDs will be available for other nodes that have not yet been routed.

If the routine finds it cannot route the selected node without violating the path minimum criteria (step 276), it checks whether PATH MINIMUM is 0 (step 278). If so, that means it is impossible to route the node with the remaining unassigned routing resources. In such event, the routine returns a ROUTING FAILURE flag to the calling routine (step 279). If at step 278 the PATH MINIMUM parameter is not already 0, the routine decrements the PATH MINIMUM parameter to 0 (step 280) and returns to step 274 to attempt once again to find the smallest possible route for the node. But this time the routine does not try to avoid using up the last wire path between any two FPIDs.

If at step 276 the routine determines that it has found a route for the node, then it determines whether it has routed all nodes on the FPCB (step 282). If not, it selects the next largest node (step 284) and returns to steps 272 and 274 where it resets the PATH MINIMUM parameter to 2 and attempts to route the newly selected node. When at step 276 the routine determines it has routed all nodes, it returns a ROUTING COMPETE flag to the calling routine (step 286).

Figure 14:
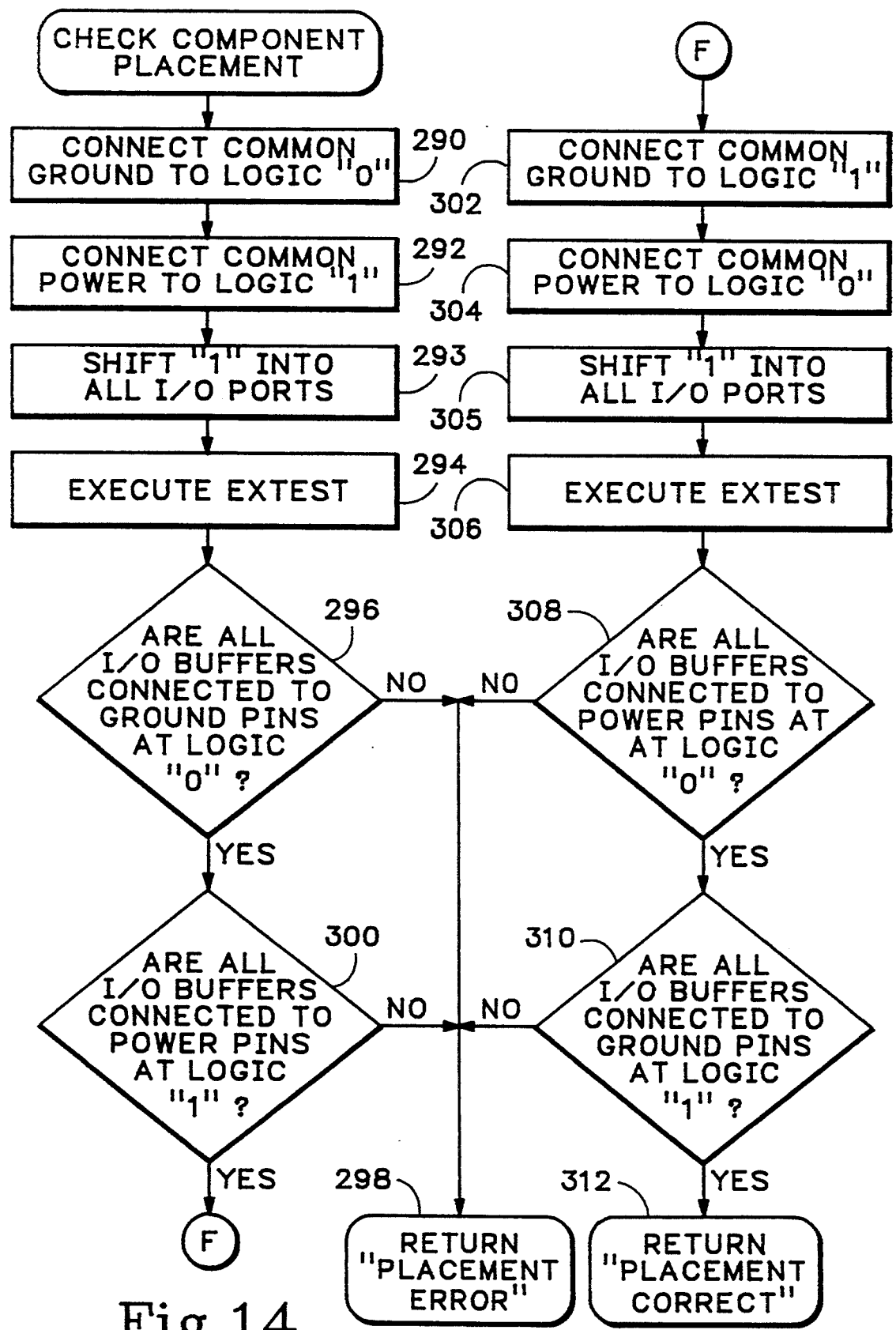

FIG. 14 illustrates the CHECK COMPONENT PLACEMENT routine called at step 208 of FIG. 10. The host computer initially programs an FPID on each FPCB to connect the ground terminals of all devices mounted in the user device socket areas of the FPCB to a logic "0" level (step 290) and to connect the power terminals of all devices to a logic "1" level (step 292). The host computer commands all FPIDs to attempt to shift a logic "1" to their buffer outputs (step 293). The FPID output ports not connected to ground will respond by driving their outputs to a logic "1" level. However, those I/O ports connected to the ground strip, which has been tied to logic "0", will remain at logic "0". The host computer executes a standard JTAG EXTEST command (step 294). In executing the EXTEST command the host computer tells all the FPIDs to transmit the data bits appearing at their I/O output ports back to the host computer via the JTAG bus. The host computer then inspects the data returned by the EXTEST command (steps 296 and 300) to determine whether those I/O buffers supposedly jumpered to the ground strip are at logic level "0" and whether those I/O buffers supposedly jumpered to the power strip are at logic level "1". If not, the user has failed to jumper the circuit device sockets that are supposedly grounded. This indicates the user may have also incorrectly placed a circuit device. In such event the routine returns to a PLACEMENT ERROR flag to the calling routine (step 298).

If the results of the tests at steps 296 and 300 are "YES", the host computer next programs an FPID on each FPCB to connect the ground terminals of all devices mounted in the user device socket areas of the FPCB to a logic "1" level (step 302) and to connect the power terminals of all devices to a logic "0" level (step 304). The host computer then again commands all FPIDs to attempt to shift a logic "1" to their buffer outputs (step 305). The FPID output ports not connected to the power strip will respond by driving their outputs to a logic "1" level. However, those I/0 ports connected to the power strip, which has been tied to logic "0", will remain at logic "0". The host computer executes an EXTEST command (step 306) and inspects the data returned (steps 308 and 310) to determine whether those I/O buffers supposedly jumpered to the power strip are at logic level "0" and whether those I/O buffers supposedly jumpered to the ground strip are at logic level "1". If not, the user has failed to correctly jumper the circuit device sockets and has probably incorrectly placed a circuit device. In such event the routine returns to a PLACEMENT ERROR flag to the calling routine (step 298). If the results of the tests at steps 308 and 310 indicate that the user has correctly placed and jumpered the power and ground terminals of all circuit devices, the routine returns a PLACEMENT CORRECT flag to the calling return.

Thus there has been described a field programmable circuit board providing a set of sockets for receiving integrated circuits and other electronic components, a set of connector pins for providing external access to the board, and an array of field programmable connection devices. The FPIDs, which selectively connect terminals of the components mounted in the sockets to one another or to the external connector pins, can be programmed to operate with various types of buffering, logic levels and delay times and to perform various logic operations at their output ports. Further described is that each FPID is capable of sampling and storing data indicating states of its ports over the several system clock cycles for subsequent read out by a host computer.

While the foregoing specification has described a preferred embodiment of the present invention, one skilled in the art may make many modifications to the preferred embodiment without departing from the invention in its broader aspects. The appended claims therefore cover all such modifications as fall within the true spirit of the invention.

We claim:

1. An apparatus responsive to externally generated route selection control data for buffering and flexibly routing hi-directional signals between input/output pins of electronic devices, said bi-directional signals being provided by said electronic devices, the apparatus comprising:

a plurality of switch port nodes;

switch means connected to said plurality of switch port nodes and receiving said externally generated route selection control data for providing separate bi-directional signal routes for ones of said bi-directional signals between selected pairs of said plurality of switch port nodes, said switch means selecting said pairs in response to said route selection control data received; and a plurality of bi-directional buffer means, each buffer means being connected between a separate one node of said plurality of switch port nodes and a separate one pin of said input/output pins of said electronic devices for buffering one bi-directional signal of said bi-directional signals between said one node and said one pin, each said buffer means comprising:

first unidirectional buffer means comprising means for providing, asserting and de-asserting a second busy signal;

second unidirectional buffer means comprising means for providing, asserting and de-asserting a first busy signal;

said first unidirectional buffer means being connected to said one node and said one pin, and having a terminal receiving said first busy signal, said first unidirectional buffer means further comprising means for detecting whether said first busy signal is either asserted or de-asserted for detecting appearance of said one bi-directional signal at said one pin, wherein said first unidirectional buffer means buffers said one bi-directional is appearing at said one pin onto said one node and asserts a second busy signal only while detecting appearance of said one bi-directional signal at said one pin while concurrently detecting said first busy signal is de-asserted and wherein at all other times said first unidirectional buffer means de-asserts said second busy signal and refrains from buffering said one bi-directional signal appearing at said one pin onto said one node; and said second unidirectional buffer means being connected to said one node and said one pin and having a terminal for receiving said second busy signal, said second unidirectional buffer means further comprising means for detecting whether said second busy signal is either asserted or de-asserted and for detecting appearance of said one bi-directional signal at said one node, wherein said second unidirectional buffer means buffers said one bi-directional signal appearing at said one node onto said one pin and asserts said first busy signal only while detecting appearance of said one bi-directional signal at said one node while concurrently detecting said second busy signal is de-asserted, and wherein at all other times said second unidirectional buffer means de-asserts said first busy signal and refrains from buffering said one bi-directional signal bearing at said one node onto said one pin.

2. The apparatus in accordance with claim 1 wherein said switch means comprises a cross-point switch.

3. An apparatus responsive to externally generated path selection control data for buffering and flexibly routing bi-directional signals between input/output pins of electronic devices, the apparatus comprising:

a plurality of port nodes;

switch means connected to said plurality of port nodes and receiving said externally generated path selection control data for providing separate bi-directional signal paths for ones of said bi-directional signals between selected pairs of said plurality of port nodes, said switch means selecting said pairs in response to said path selection control data received; and a plurality of bi-directional buffer means, each buffer means being connected between a separate one node of said plurality of port nodes and a separate one pin of said input/output pins of said electronic devices for providing a separate buffered signal path in a selected direction between said one node and said one pin, each buffer means automatically selecting said direction by detecting first appearance of one signal of said bi-directional signals at either one of said one node or said one pin and then directing said signal path toward another of said one node of said one pin, wherein at least one of said each bi-directional buffer means connected between said separate one node and said separate one pin comprises:

first driver means having first and second input terminals and a first output terminal;

second driver means having third and fourth input terminals and a second output terminal;

first single-shot means having a fifth input terminal and a third output terminal;

second single-shot means having a sixth input terminal and a fourth output terminal;

first logic means having seventh, eighth and ninth input terminals and a fifth output terminal;

second logic means having tenth, eleventh and twelfth input terminals and a sixth output terminal;

first conductive means connecting said one pin, said first output terminal and said ninth input terminal for conveying a first bi-directional signal of said bi-directional signals therebetween;

second conductive means connecting said one port node, said second output terminal and said twelfth input terminal for conveying a second bi-directional signal of said bi-directional signals therebetween;

third conductive means connecting said third output terminal and said first and eighth input terminals for conveying a third control signal therebetween;

fourth conductive means connecting said fourth output terminal and said third and eleventh input terminals for conveying a fourth control signal therebetween;

fifth conductive means connecting said fifth output terminal and said fourth, sixth and tenth input terminals for conveying a fifth control signal therebetween; and sixth conductive means connecting said sixth output terminal and said second, fifth and seventh input terminals for conveying a sixth control signal therebetween;

said first driver means driving said first bi-directional signal to a first logic state in response to assertion of said third control signal and driving said first bi-directional signal to a second logic state in response to assertion of said sixth control signal, said second driver means driving said second bi-directional signal to a third logic state in response to assertion of said fourth control signal and driving said second bi-directional signal to a fourth logic state in response to assertion of said fifth control signal, said first single-shot means pulse asserting said third control signal in response to said sixth control signal, said second single-shot means pulse asserting said fourth control signal in response to said fifth control signal, said first logic means controlling assertion of said fifth control signal in response to logical combinations of states of said first bi-directional signal and said third and sixth control signals, and said second logic means controlling assertion of said sixth control signal in response to logical combinations of states of said second bi-directional signal and said fourth and fifth control signals.

4. An apparatus responsive to externally generated path selection control data for buffering and flexibly routing bi-directional signals between input/output pins of electronic devices, the apparatus comprising:

a plurality of port nodes;

switch means connected to said plurality of port nodes and receiving said externally-generated path selection control data for providing separate bi-directional signal paths for ones of said bi-directional signals between selected pairs of said plurality of port nodes, said switch means selecting said pairs in response to said path selection control data received; and a plurality of bi-directional buffer means, each buffer means being connected between a separate one node of said plurality of port nodes and a separate one pin of said input/output pins of said electronic devices for providing a separate buffered signal path in a selected direction between said one node and said one pin, each buffer means automatically selecting said direction by detecting first appearance of one signal of said bi-directional signals at either one of said one node or said one pin and then directing said signal path toward another of said one node of said one pin, wherein at least one of said each bi-directional buffer means connected between said separate one node and said separate one pin comprises:

first driver means having first and second input terminals and a first output terminal;

second driver means having third and fourth input terminals and a second output terminal;

first single-shot means having a fifth input terminal and a third output terminal;

second single-shot means having a sixth input terminal and a fourth output terminal;

first logic means having seventh, eighth and ninth and thirteenth input terminals and a fifth output terminal;

second logic means having tenth, eleventh, twelfth and fourteenth input terminals, a second control data input and a sixth output terminal;

first conductive means connecting said one pin, said first output terminal and said ninth input terminal for conveying a first bi-directional signal of said bi-directional signals therebetween;

second conductive means connecting said one port node, said second output terminal and said twelfth input terminal for conveying a second bi-directional signal of said bi-directional signals therebetween;

third conductive means connecting said third output terminal and said first and eighth input terminals for conveying a third control signal therebetween;

fourth conductive means connecting said fourth output terminal and said third and eleventh input terminals for conveying a fourth control signal therebetween;

fifth conductive means connecting said fifth output terminal and said fourth, sixth and tenth input terminals for conveying a fifth control signal therebetween;

sixth conductive means connecting said sixth output terminal and said second, fifth and seventh input terminals for conveying a sixth control signal therebetween;

control means, having at least one seventh output terminals, storing logic control data and generating a seventh control signal at said at least one seventh output terminal, said seventh control signal having logic states in accordance to a value of the stored logic control data; and seventh conductive means connecting said at least one seventh output terminal and said thirteenth and fourteenth input terminals for conveying said seventh control signal therebetween, said first driver means driving said first bi-directional signal to a first logic state in response to assertion of said third control signal and driving said first bi-directional signal to a second logic state in response to assertion of said sixth control signal, said second driver means driving said second bi-directional signal to a third logic state in response to assertion of said fourth control signal and driving said second bi-directional signal to a fourth logic state in response to assertion of said fifth control signal, said first single-shot means pulse asserting said third control signal in response to said sixth control signal, said second single-shot means pulse asserting said fourth control signal in response to said fifth control signal, said first logic means controlling assertion of said fifth control signal in response to logical combinations of states of said first bi-directional signal and said third, sixth and seventh control signals, and said second logic means controlling assertion of said sixth control signal in response to logical combinations of states of said second bi-directional signal and said fourth, fifth and seventh control signals.

5. The apparatus in accordance with claim 4 wherein said first logic means asserts said fifth control signal in adjustably delayed response to logical combinations of states of said first bi-directional signal and said third and sixth control signals, with a delay duration being controlled by said seventh control signal.

* * * * *

UNITED STATES PATENT AND TRADEMARK OFFICE
CERTIFICATE OF CORRECTION

PATENT NO. : 5,426,738
DATED : June 20, 1995
INVENTOR(S) : Wen-Jai HSIEH et al

It is certified that error appears in the above-indentified patent and that said Letters Patent is hereby corrected as shown below:

Column 19, claim 1, line 35, "is" should read ---signal---.
Column 19, claim 1, line 63, "bearing" should read ---appearing---.

Signed and Sealed this

Twenty-seventh Day of February, 1996

Attest:

BRUCE LEHMAN

Attesting Officer        Commissioner of Patents and Trademarks